US012765260B2

(12) United States Patent
Bong et al.

(10) Patent No.: US 12,765,260 B2
(45) Date of Patent: Oct. 13, 2026

(54) THERMOELECTRIC DEVICE AND THERMOELECTRIC SYSTEM COMPRISING SAME

(71) Applicant: LG INNOTEK CO., LTD., Seoul (KR)

(72) Inventors: Sang Hoon Bong, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 19/132,500

(22) PCT Filed: Nov. 29, 2023

(86) PCT No.: PCT/KR2023/019411
§ 371 (c)(1),
(2) Date: May 23, 2025

(87) PCT Pub. No.: WO2024/117759
PCT Pub. Date: Jun. 6, 2024

(65) Prior Publication Data

US 2026/0190860 A1 Jul. 2, 2026

(30) Foreign Application Priority Data

Nov. 29, 2022 (KR) ........................ 10-2022-0162519
Nov. 29, 2022 (KR) ........................ 10-2022-0162520
(Continued)

(51) Int. Cl.
*H10N 10/17* (2023.01)

(52) U.S. Cl.
CPC .................................. *H10N 10/17* (2023.02)

(58) Field of Classification Search
None
See application file for complete search history.

(56) References Cited

FOREIGN PATENT DOCUMENTS

KR 10-2020-0015126 2/2020
KR 10-2083611 3/2020
(Continued)

OTHER PUBLICATIONS

International Search Report dated Feb. 29, 2024 issued in Application No. PCT/KR2023/019411.
(Continued)

*Primary Examiner* — Dustin Q Dam
(74) *Attorney, Agent, or Firm* — KED & ASSOCIATES, LLP

(57) ABSTRACT

A thermoelectric device according to one embodiment of the present invention comprises: a fluid flow portion comprising a first surface and a second surface spaced apart from the first surface in a first direction; a first thermoelectric module disposed on the first surface; a second thermoelectric module disposed on the second surface; a first shield member disposed on a third surface formed between the first surface and the second surface; a second shield member disposed on a fourth surface formed between the first surface and the second surface and facing the third surface; and a third shield member disposed on the first surface and the first thermoelectric module, and extended to the third surface and the fourth surface, wherein the third shield member comprises a 3-1 area disposed on the third surface, a 3-2 area disposed on the first surface, and a 3-3 area disposed on the fourth surface, and the third surface, the first shield member, and the 3-1 area of the third shield member area sequentially disposed along the direction from the fourth surface towards the third surface, and the fourth surface, the second shield member, and the 3-3 area of the third shield member are sequentially disposed along the direction from the third surface towards the fourth surface.

20 Claims, 22 Drawing Sheets

(30) Foreign Application Priority Data

May 2, 2023 (KR) ........................ 10-2023-0057263
May 2, 2023 (KR) ........................ 10-2023-0057264

(56) References Cited

FOREIGN PATENT DOCUMENTS

| | | | | |
|---|---|---|---|---|
| KR | 10-2021-0069432 | | 6/2021 | |
| KR | 10-2021-0090997 | | 7/2021 | |
| KR | 10-2021-0156535 | | 12/2021 | |
| KR | 20210156536 A | * | 12/2021 | ............ H01L 35/32 |
| KR | 10-2022-0037173 | | 3/2022 | |

OTHER PUBLICATIONS

Korean Office Action dated Mar. 26, 2026, issued in Application No. 10-2023-0057263.

* cited by examiner

[FIG. 1]
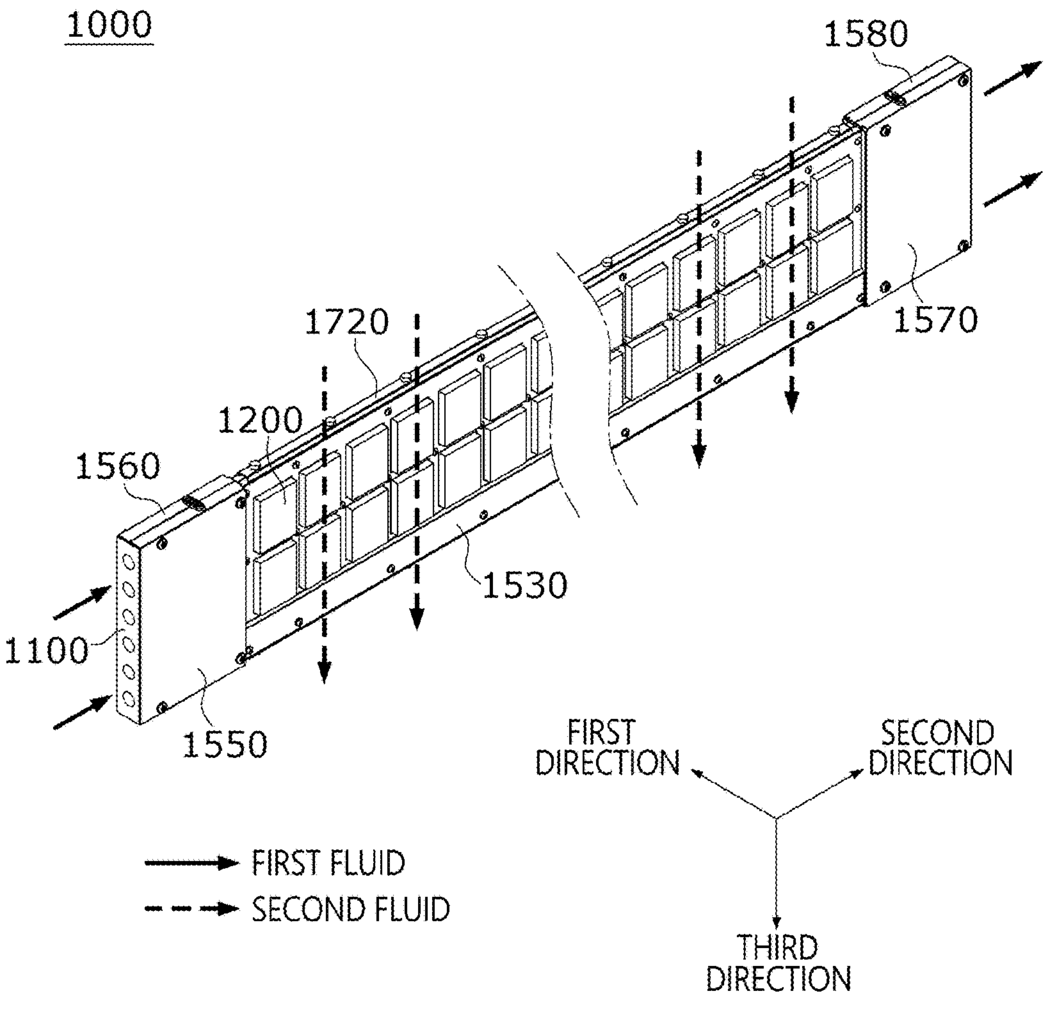

[FIG. 2]
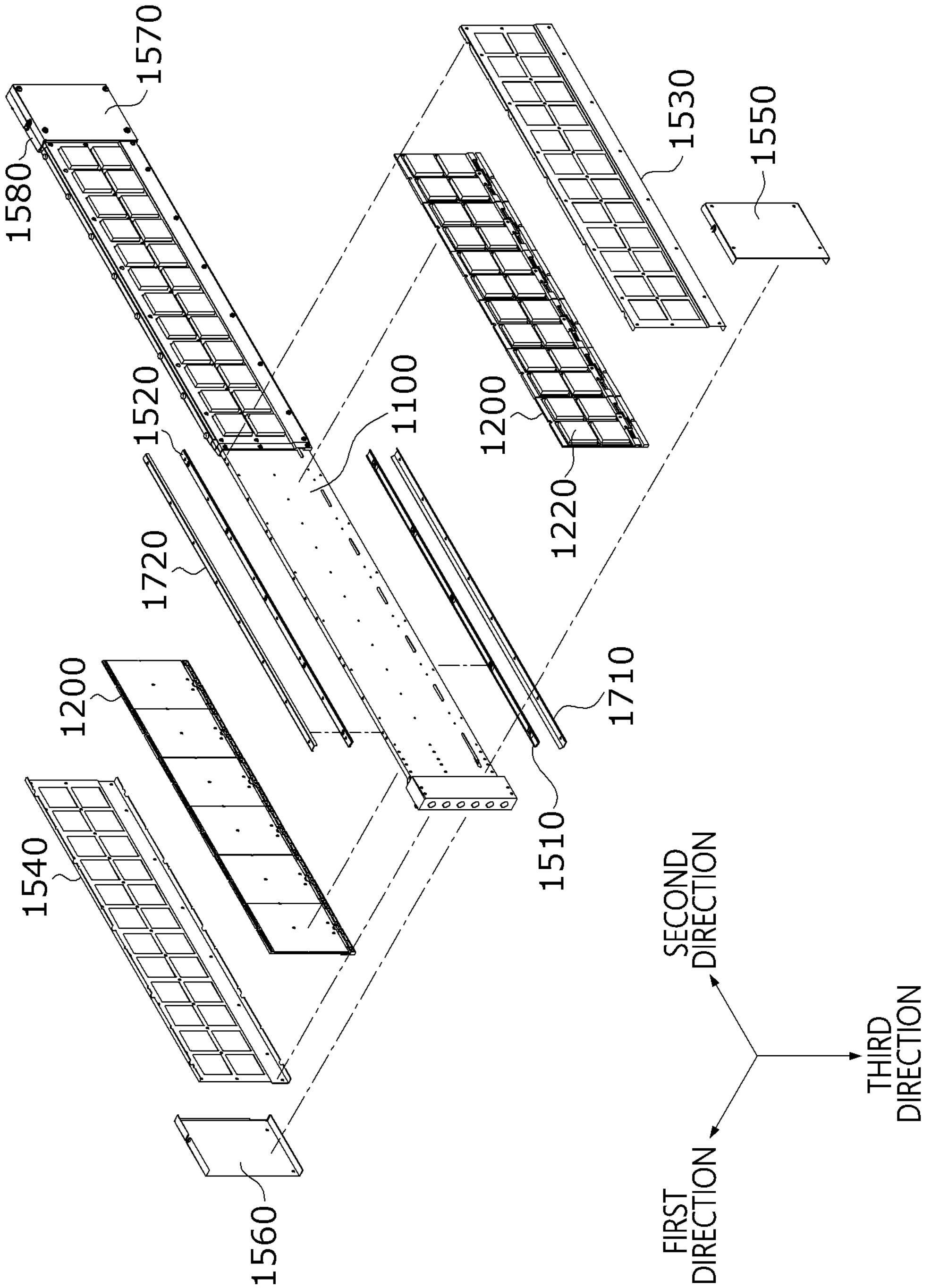

[FIG. 3]
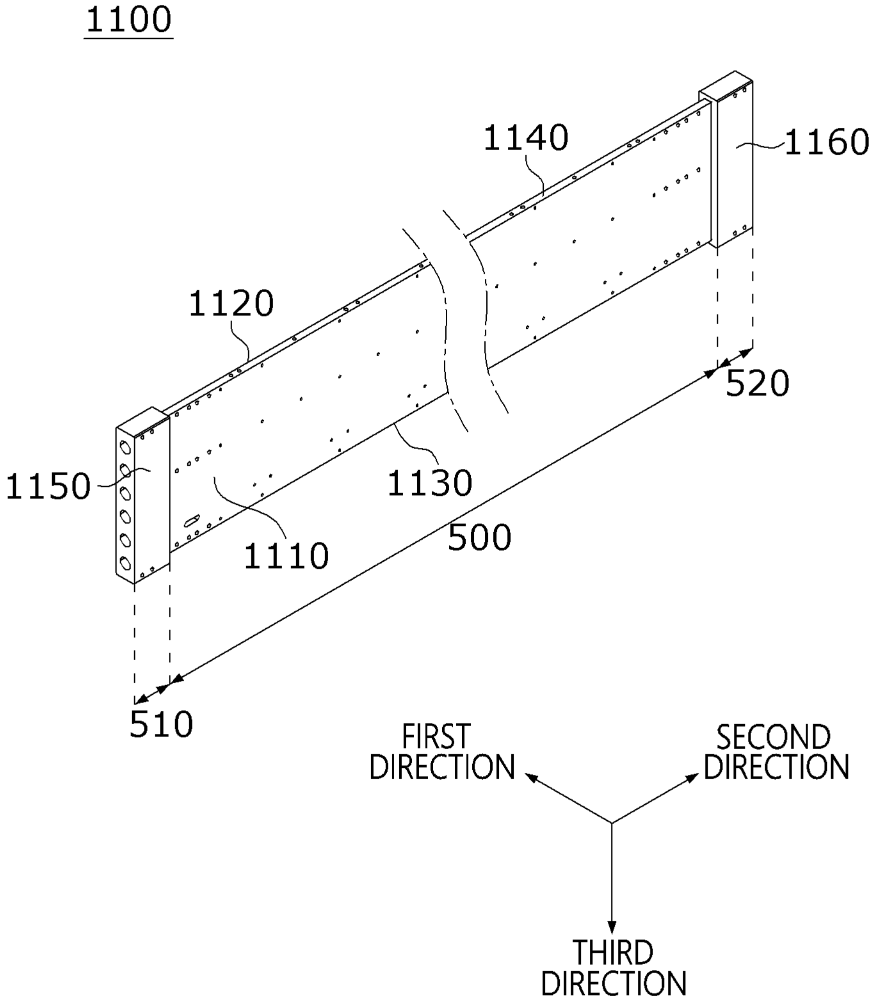

[FIG. 4]
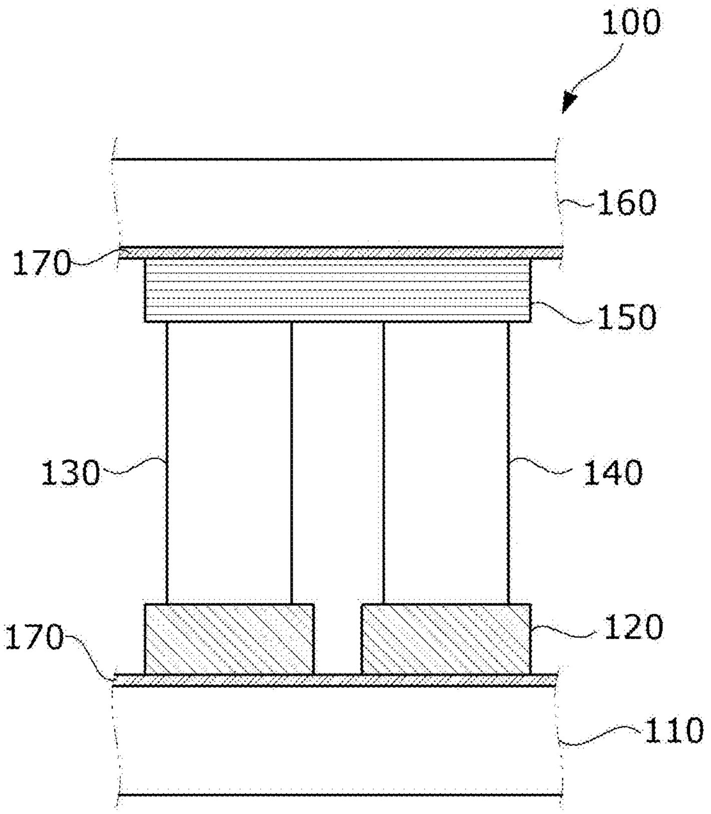

[FIG. 5]
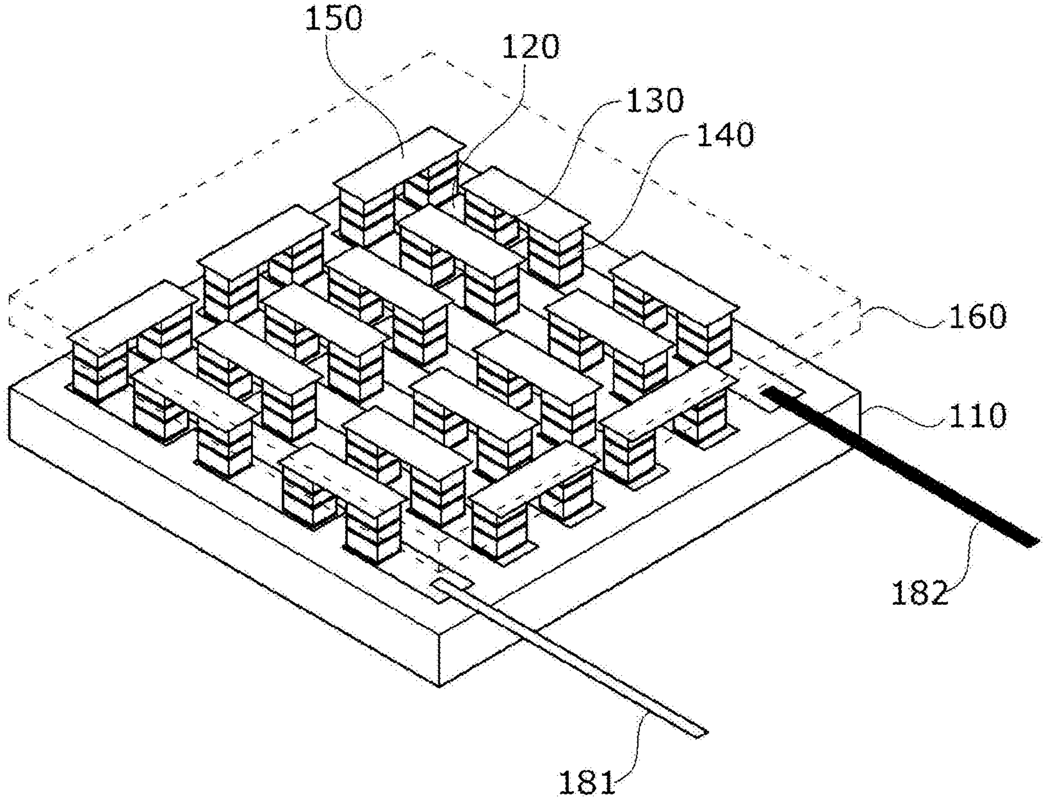

[FIG. 6]
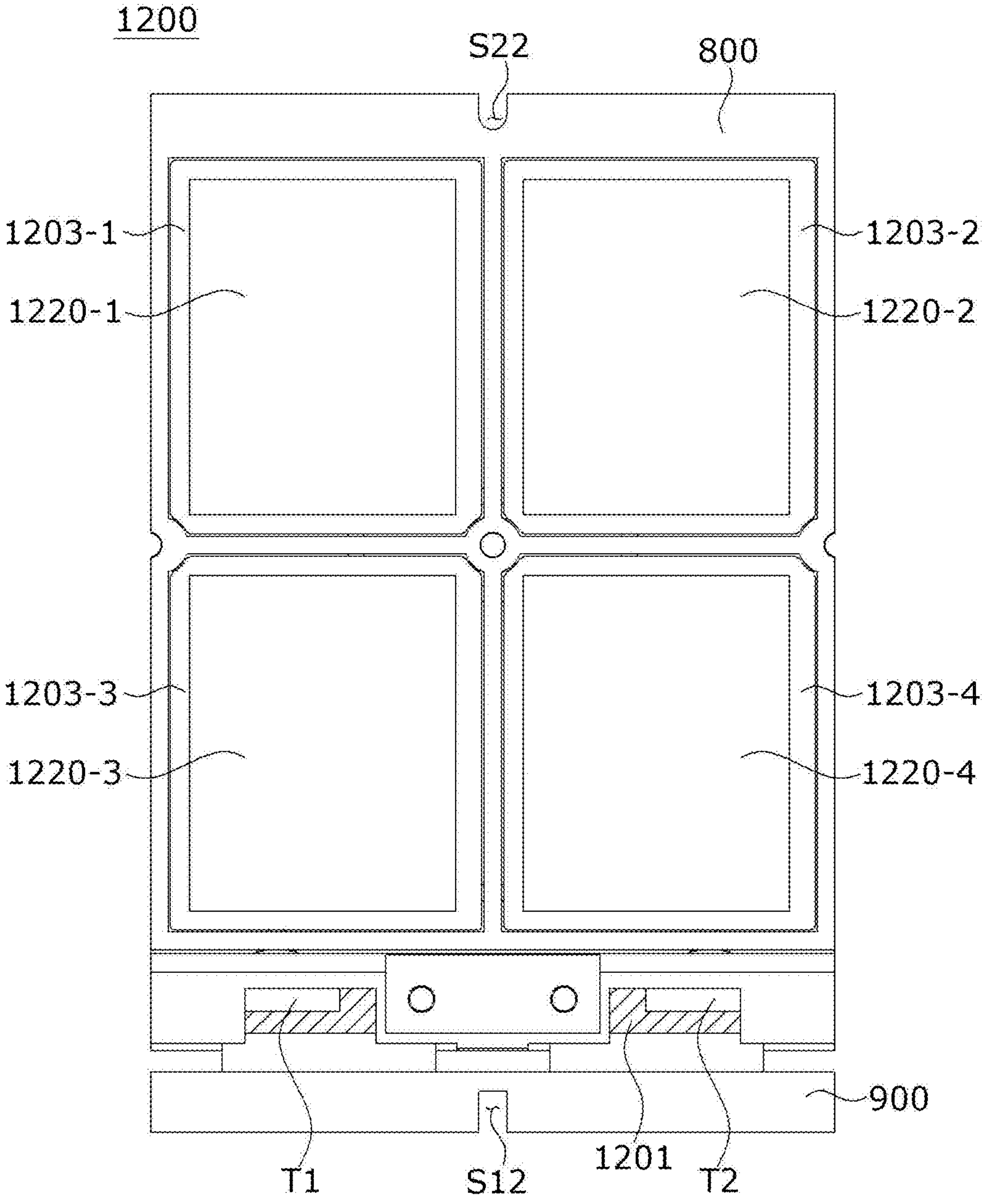

[FIG. 7]
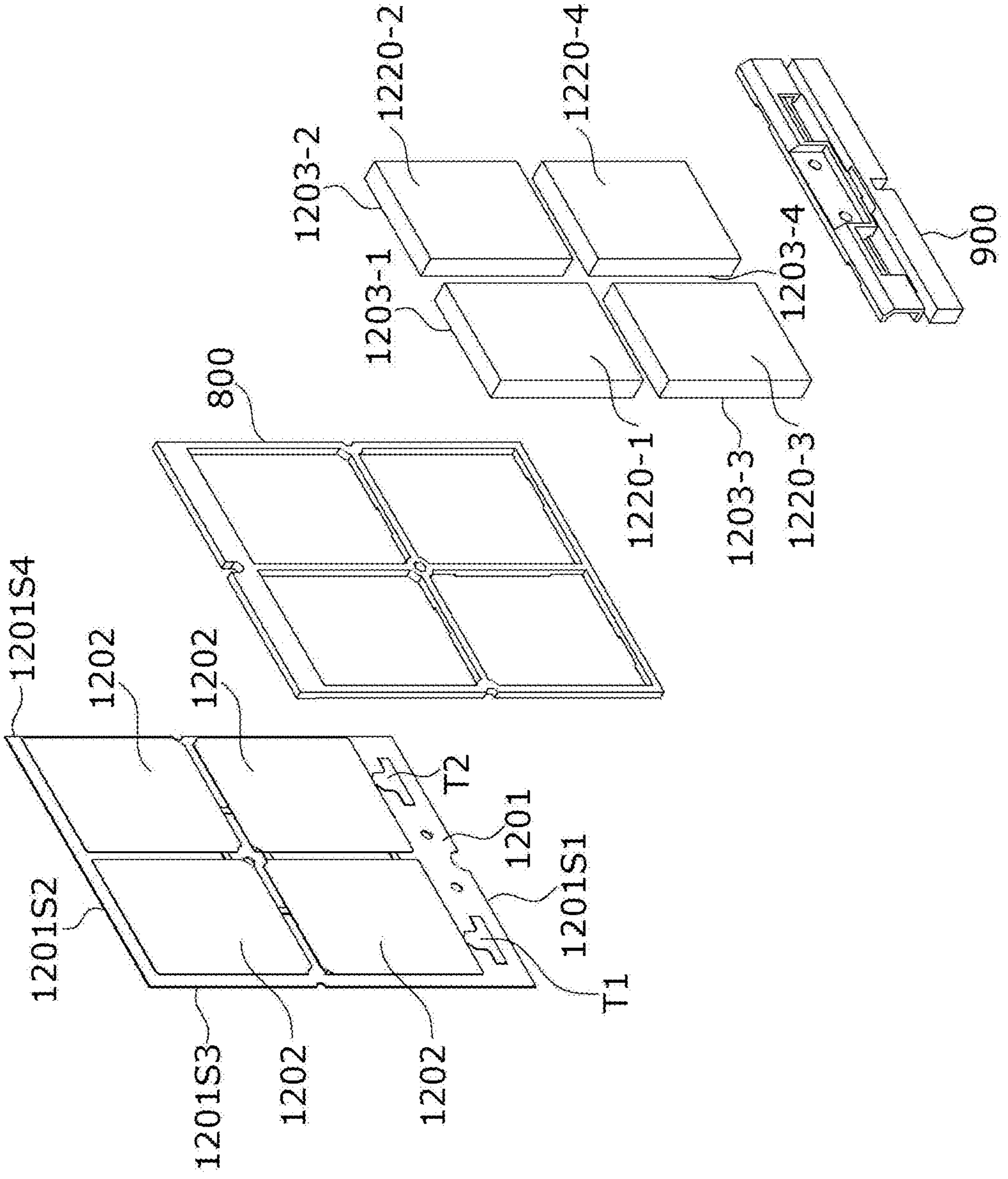

[FIG. 8]
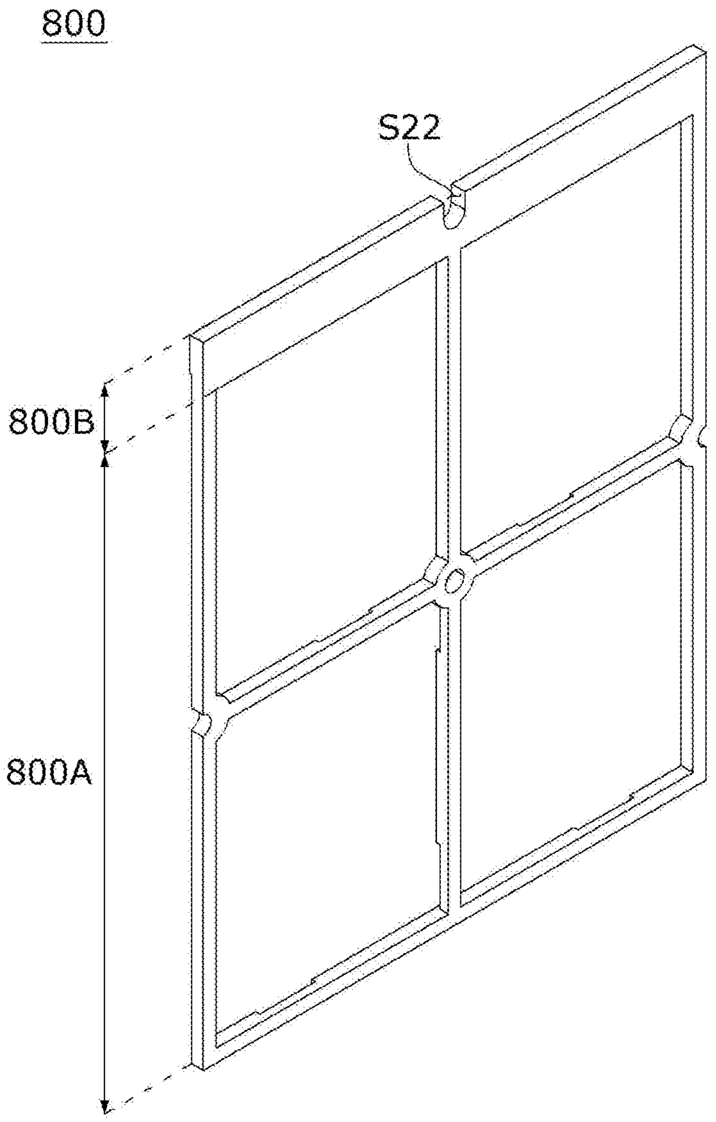

[FIG. 9]
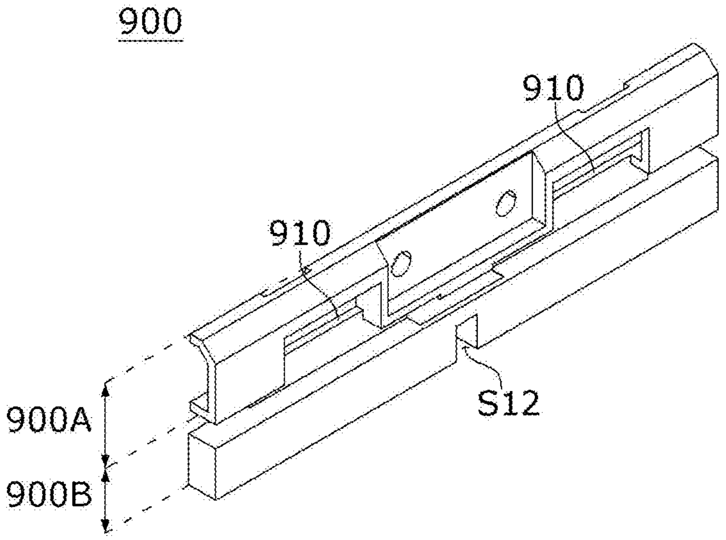

[FIG. 10]
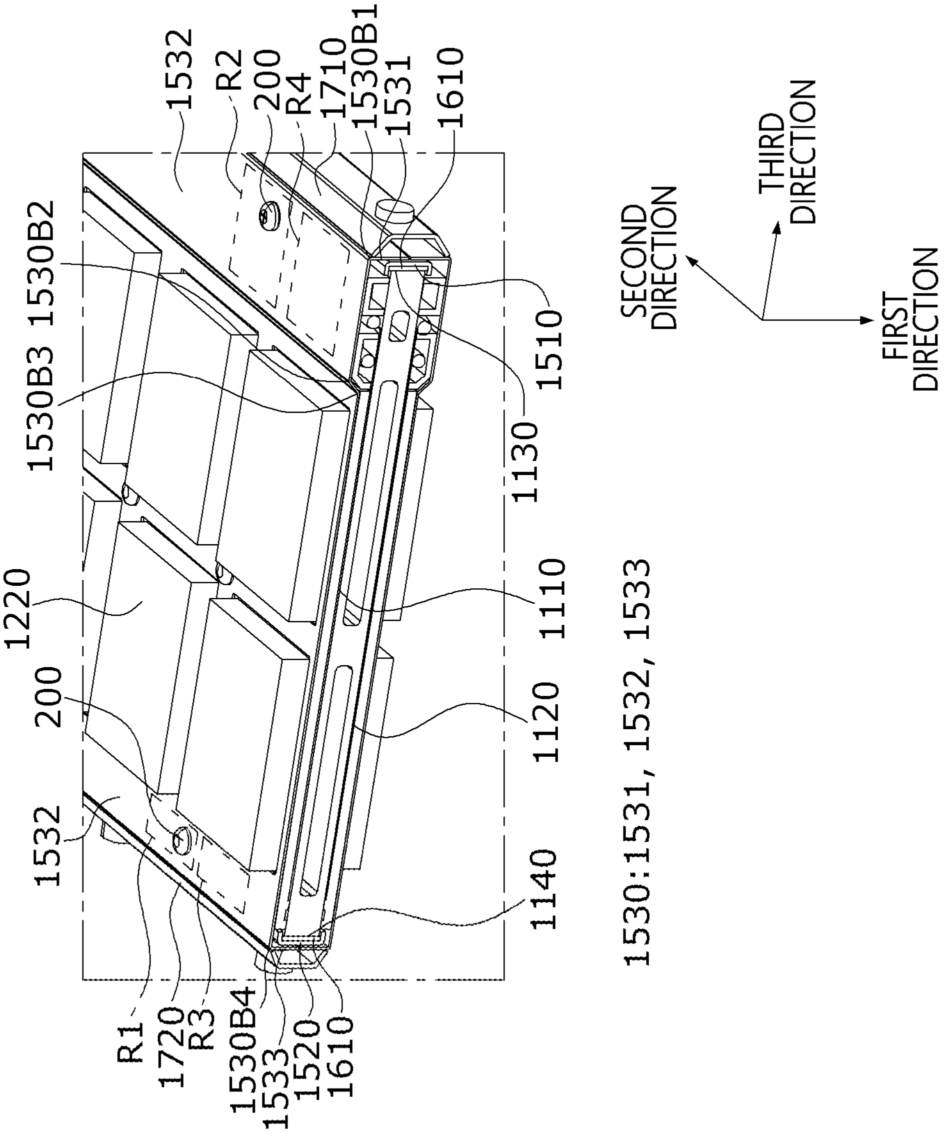

[FIG. 11]
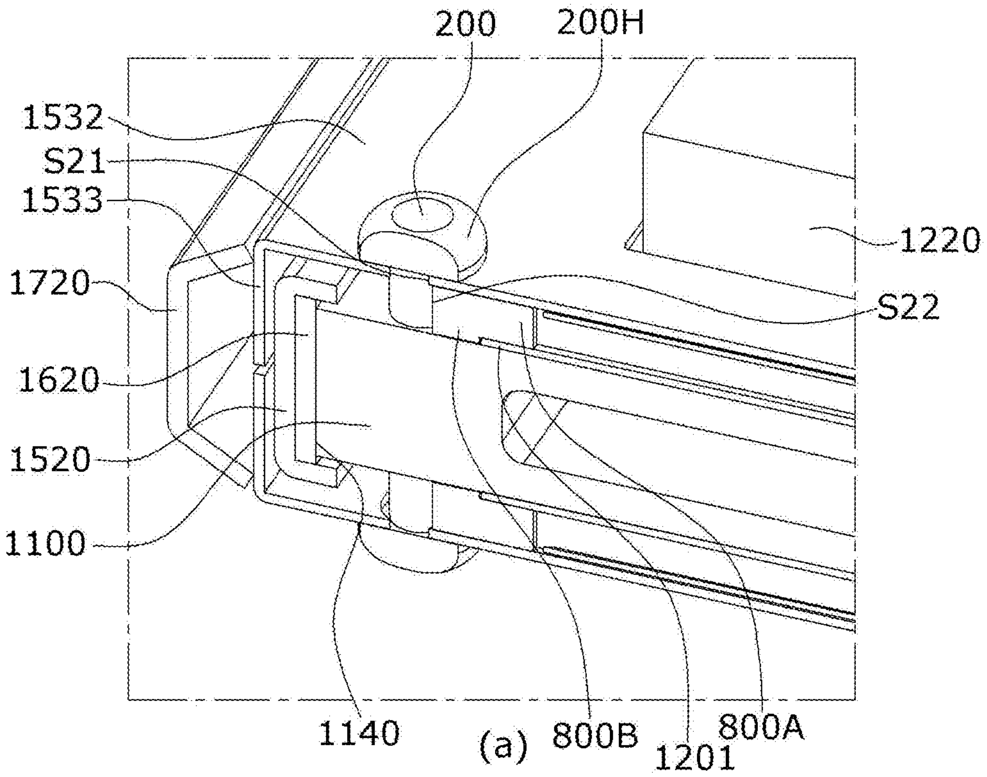
(a)
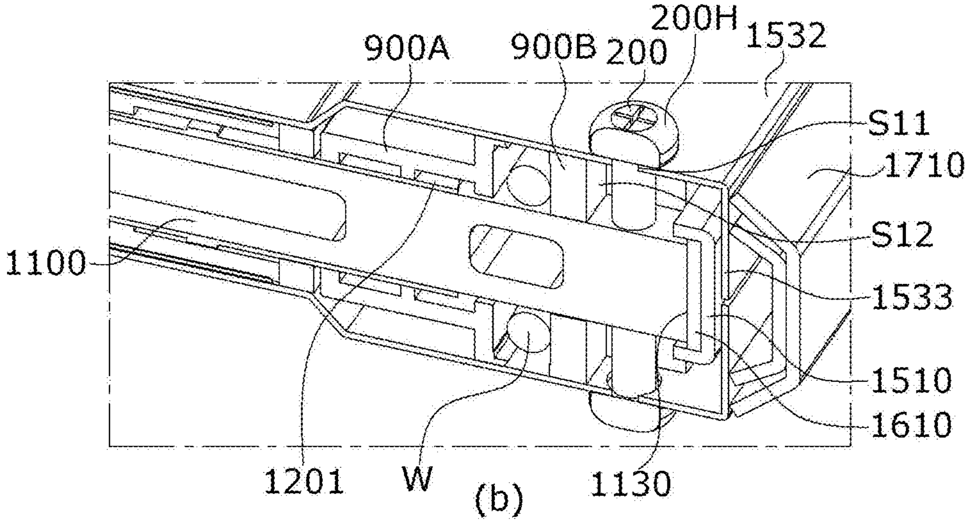
(b)
1530: 1531, 1532, 1533

[FIG. 12]
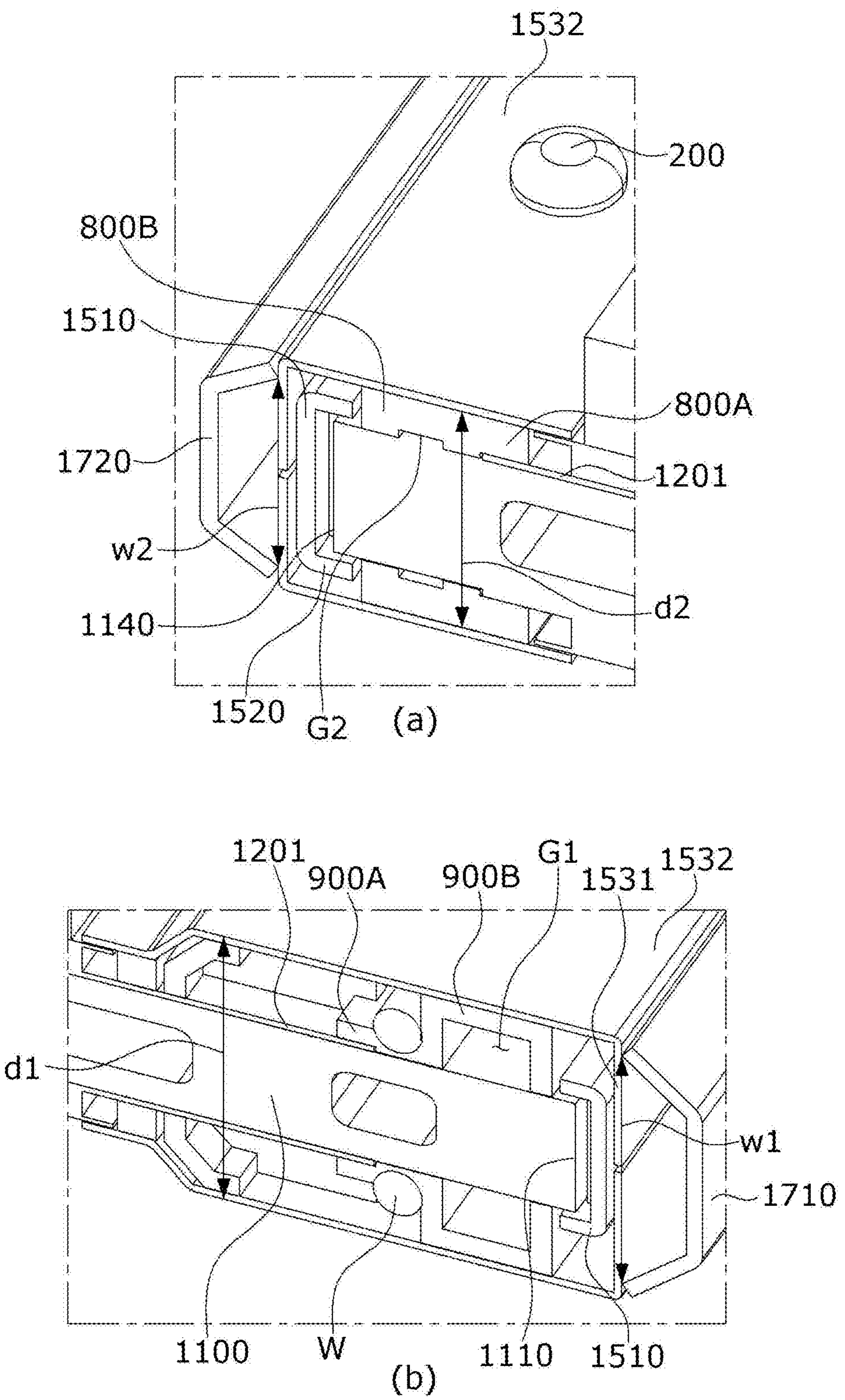

[FIG. 13]
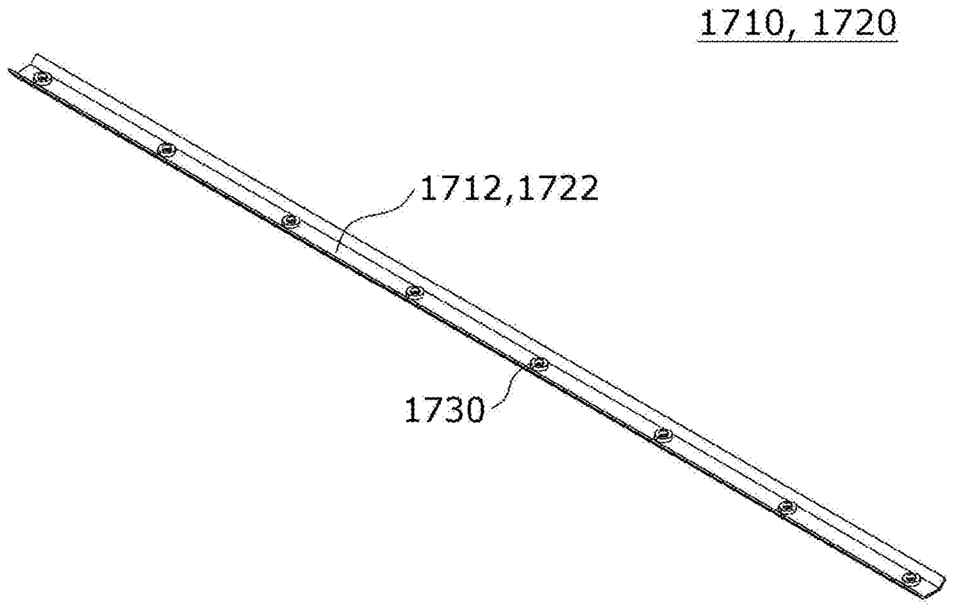

[FIG. 14]
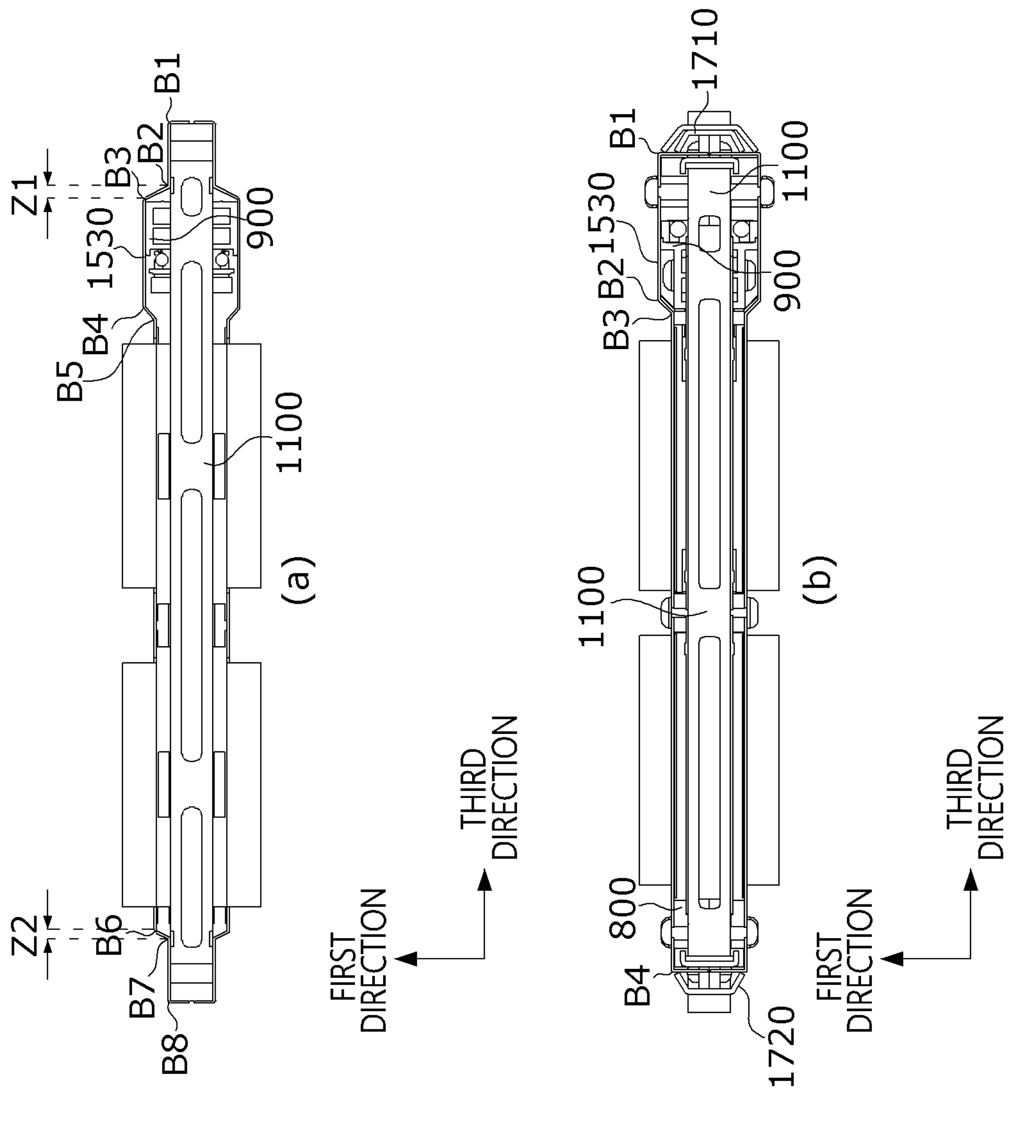

[FIG. 15]
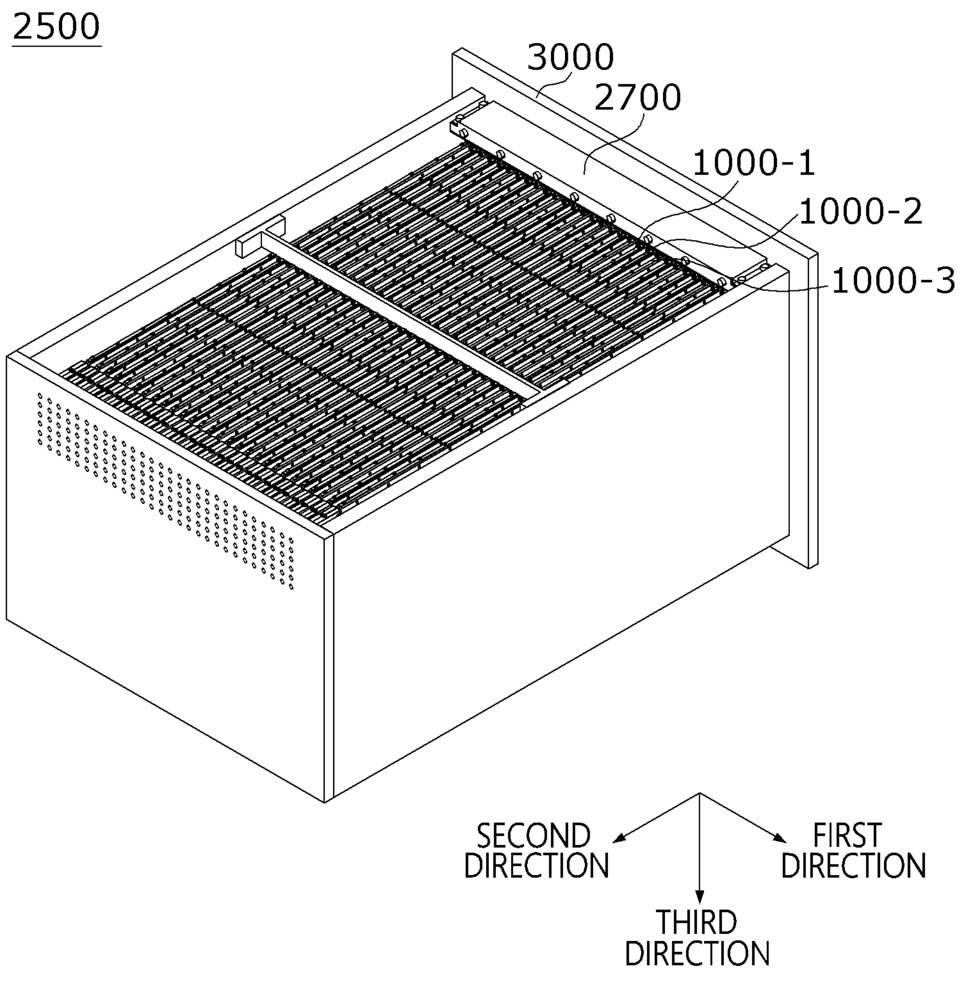

[FIG. 16]
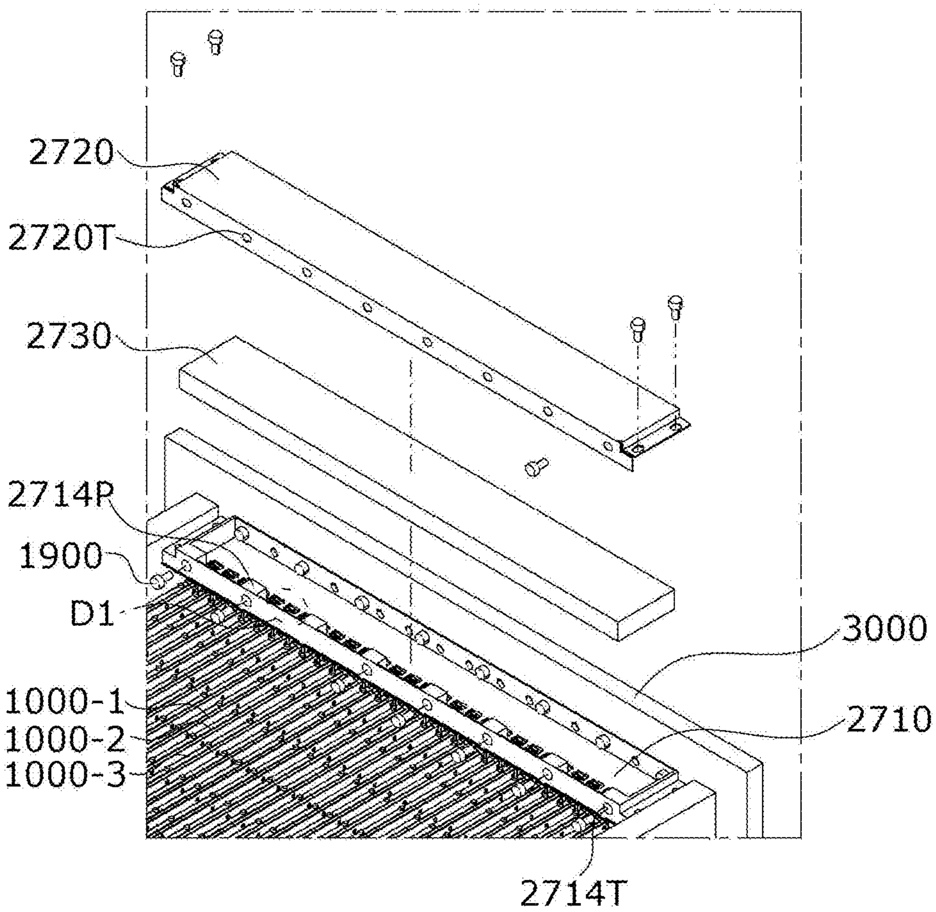

[FIG. 17]
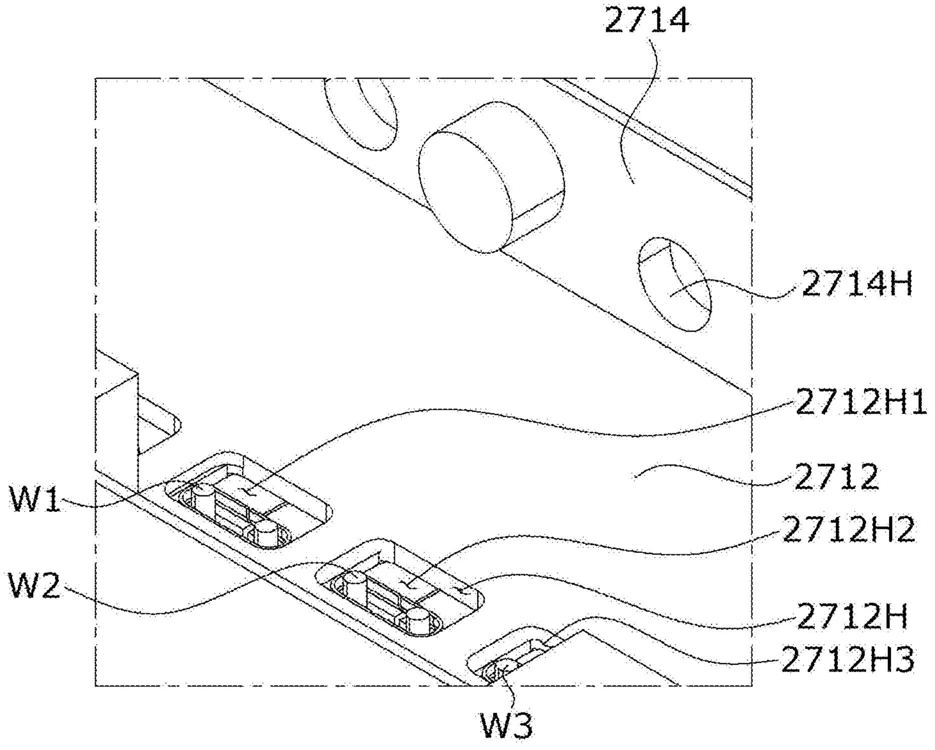
2712H: 2712H1, 2712H2, 2712H3

[FIG. 18]
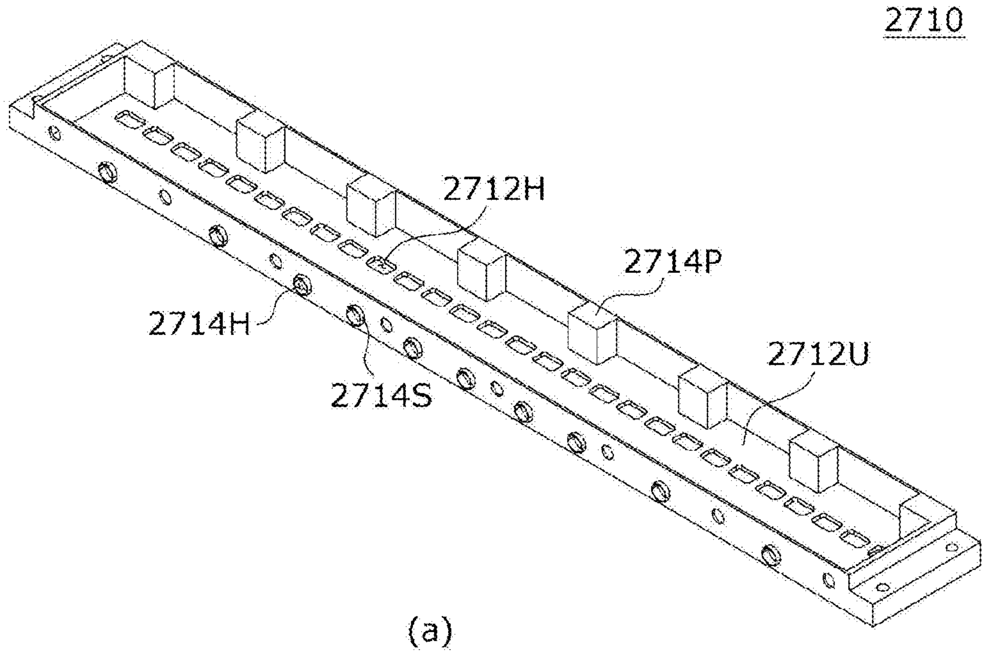
(a)
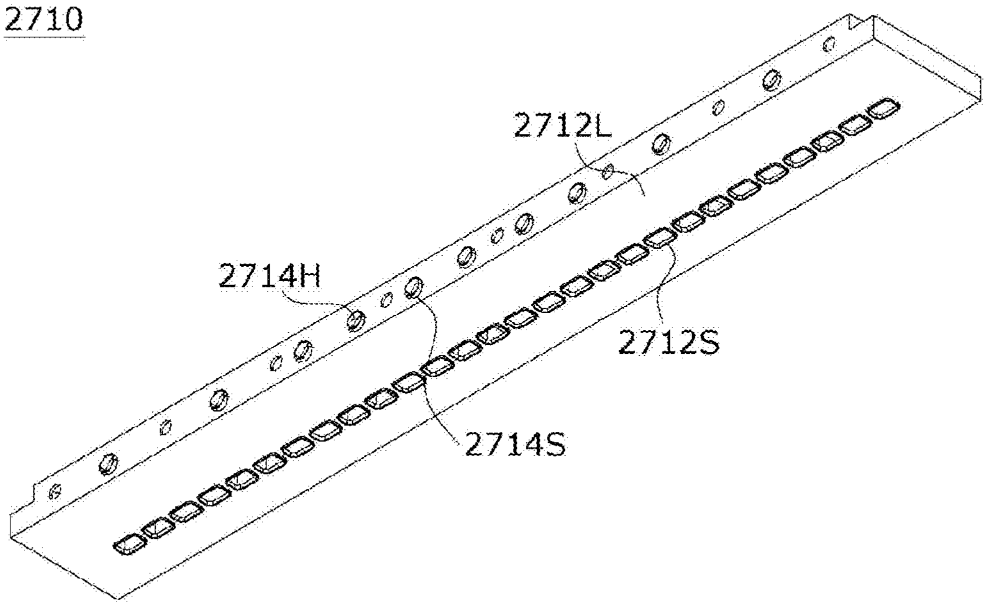
(b)

[FIG. 19]
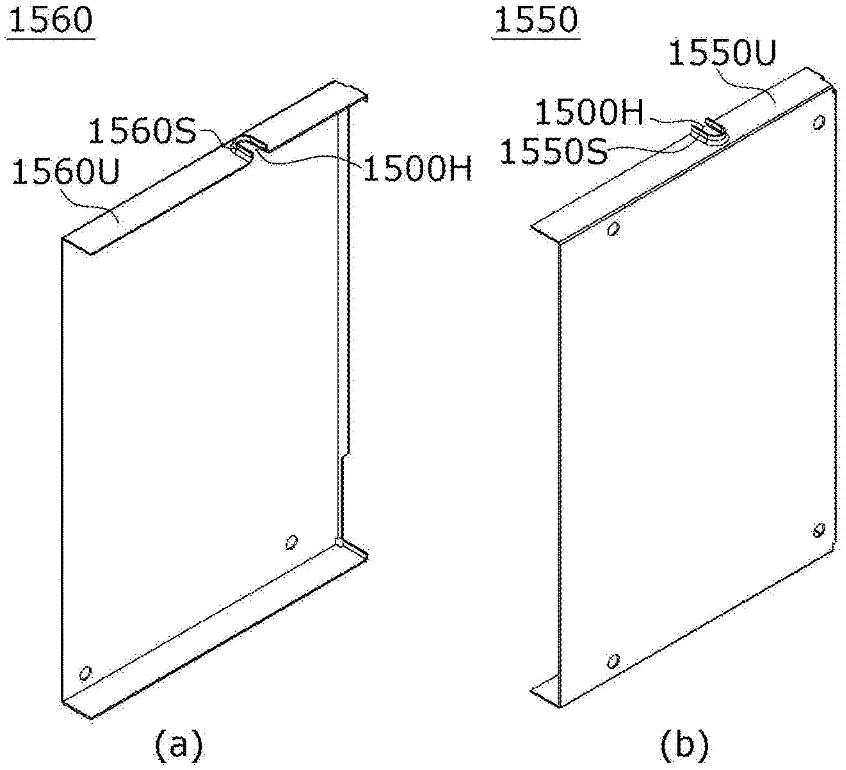

[FIG. 20]
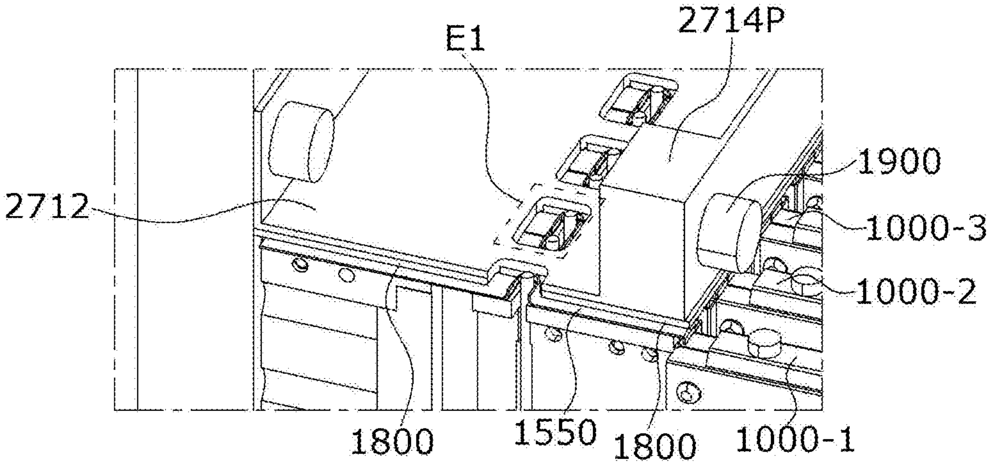
[FIG. 21]
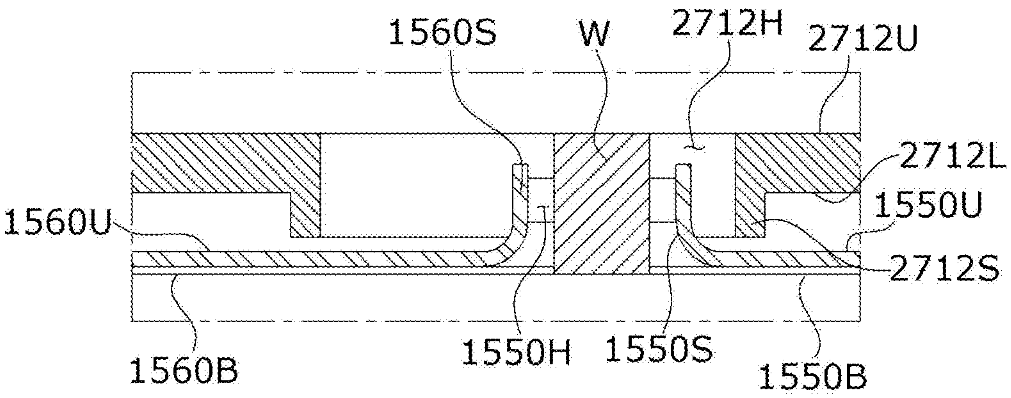

[FIG. 22]
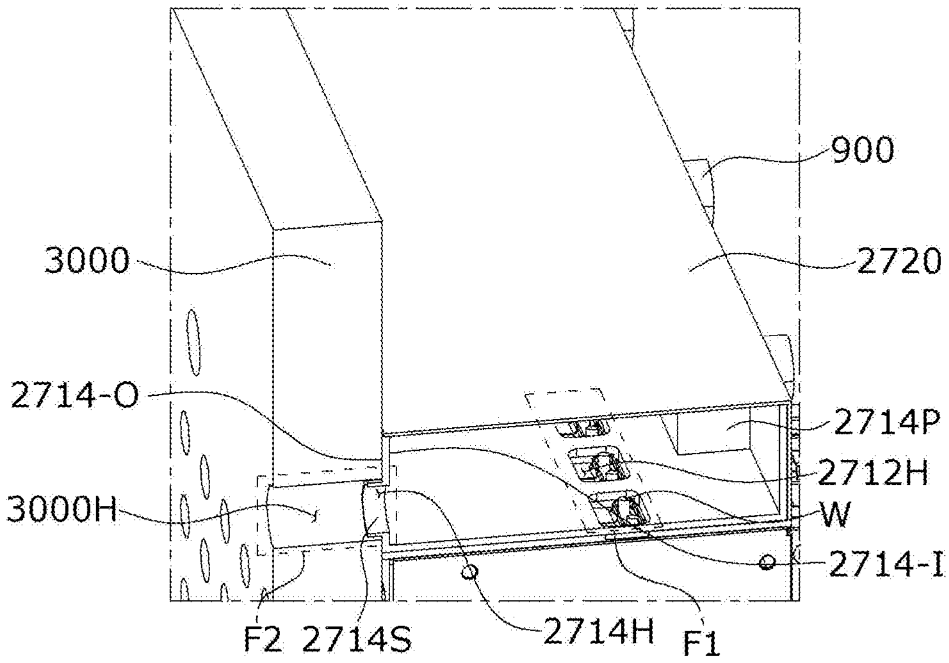
[FIG. 23]
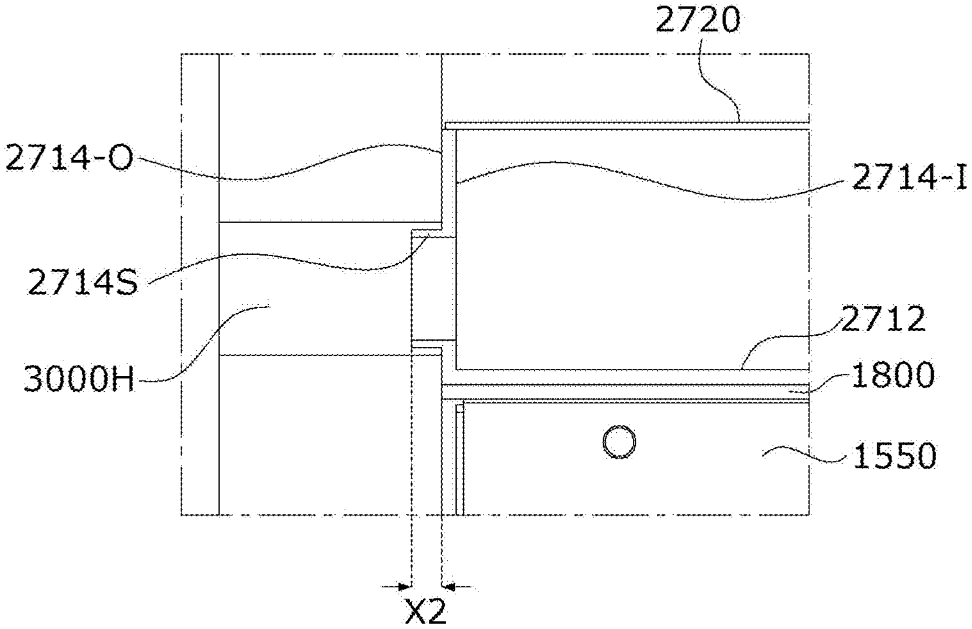

[FIG. 24]
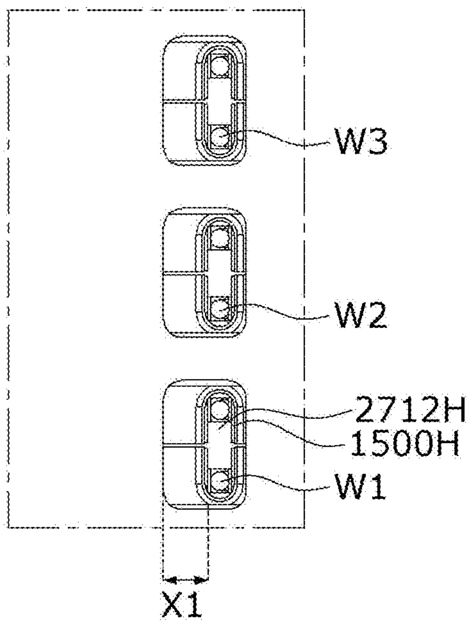

THERMOELECTRIC DEVICE AND THERMOELECTRIC SYSTEM COMPRISING SAME

CROSS-REFERENCE TO RELATED PATENT APPLICATIONS

This application is a U.S. National Stage Application under 35 U.S.C. § 371 of PCT Application No. PCT/KR2023/019411, filed Nov. 29, 2023, which claims priority to Korean Patent Application Nos. 10-2022-0162519, filed Nov. 29, 2022, 10-2022-0162520, filed Nov. 29, 2022, 10-2023-0057263, filed May 2, 2023 and 10-2023-0057264, filed May 2, 2023, whose entire disclosures are hereby incorporated by reference.

TECHNICAL FIELD

The present invention relates to a thermoelectric device, and more specifically, to a thermoelectric device that utilizes a temperature difference between a low temperature part and a high temperature part of a thermoelectric element, and a thermoelectric system including the same.

BACKGROUND ART

A thermoelectric effect is a phenomenon that occurs due to movement of electrons and holes within a material, and refers to direct energy conversion between heat and electricity.

Thermoelectric elements are a general term for elements that utilize the thermoelectric phenomenon, and have a structure that forms a pn junction pair by bonding a P-type thermoelectric material and an N-type thermoelectric material between metal electrodes.

Thermoelectric elements may be classified into elements that utilize temperature changes in electrical resistance, elements that utilize the Seebeck effect which is a phenomenon in which an electromotive force is generated by a temperature difference, and elements that utilize the Peltier effect which is a phenomenon in which heat absorption or heat generation occurs due to an electric current.

Thermoelectric elements are widely used in home appliances, electronic components, and communication components. For example, thermoelectric elements may be used in cooling devices, heating devices, and power generation devices. Thus, the demand for thermoelectric performance of the thermoelectric elements is increasing.

Recently, there is a need to generate electricity using thermoelectric elements and high temperature heat in automobiles, ships, or the like. In this case, a fluid flow portion through which a first fluid passes is disposed at the low temperature part side of the thermoelectric element, a heat sink is disposed at the high temperature part side of the thermoelectric element, and a second fluid having a higher temperature than the first fluid has may pass through the heat sink. Accordingly, electricity can be generated by a temperature difference between the low temperature part and the high temperature part of the thermoelectric element.

DETAILED DESCRIPTION OF INVENTION

Technical Problem

The present invention is directed to providing a thermoelectric device that utilizes a temperature difference between a low temperature part and a high temperature part of a thermoelectric element, and a thermoelectric system including the same.

Technical Solution

A thermoelectric device according to an embodiment of the present invention includes a fluid flow portion including a first surface and a second surface spaced apart from the first surface in a first direction, a first thermoelectric module disposed on the first surface, a second thermoelectric module disposed on the second surface, a first shield member disposed on a third surface formed between the first surface and the second surface, a second shield member disposed on a fourth surface which is formed between the first surface and the second surface and faces the third surface, and a third shield member disposed on the first surface and the first thermoelectric module and configured to extend to the third surface and the fourth surface, wherein the third shield member includes a 3-1 region disposed on the third surface, a 3-2 region disposed on the first surface, and a 3-3 region disposed on the fourth surface, and the third surface, the first shield member and the 3-1 region of the third shield member are sequentially disposed in a direction from the fourth surface toward the third surface, and the fourth surface, the second shield member and the 3-3 region of the third shield member are sequentially disposed in a direction from the third surface toward the fourth surface.

The third shield member may include four or less curved portions from the 3-1 region to the 3-3 region.

The third shield member may include a first curved portion disposed between the 3-1 region and the 3-2 region, second and third curved portions disposed within the 3-2 region, and a fourth curved portion disposed between the 3-2 region and the 3-3 region.

The thermoelectric device may further include a first fluid guide disposed on the 3-1 region in a direction from the fourth surface toward the third surface, and a second fluid guide disposed on the 3-3 region in a direction from the third surface toward the fourth surface.

At least one of the first fluid guide and the second fluid guide may include a surface parallel to at least one of the third surface and the fourth surface.

A maximum width of the first fluid guide in the first direction may be greater than a maximum width of the second fluid guide in the first direction.

The first thermoelectric module may includes a first substrate disposed on the first surface, a first electrode part disposed on the first substrate, a semiconductor device disposed on the first electrode part, a second electrode part disposed on the semiconductor device, a second substrate disposed on the second electrode part, a heat sink disposed on the second substrate, a first frame, a part of which is disposed on the first substrate and a remaining portion of which is disposed between a first perimeter of the first substrate and the third surface on the first surface, and a second frame, a part of which is disposed on the first substrate and a remaining portion of which is disposed between a second perimeter of the first substrate and the fourth surface on the first surface.

First through holes corresponding to each other may be disposed in each of the remaining portion of the first frame and the third shield member, the first through holes may not overlap the first substrate in the first direction, second through holes corresponding to each other may be disposed in each of the remaining portion of the second frame and the third shield member, and the second through holes may not overlap the first substrate in the first direction.

At least one of the remaining portion of the first frame and the remaining portion of the second frame may include an upper surface disposed to face the third shield member and a lower surface disposed to face the first surface, a groove may be formed in the lower surface, and a depth of the groove in the first direction may be greater than a height of the first substrate in the first direction.

The groove may be filled with a sealant.

The thermoelectric device may further include a fourth shield member disposed on the second surface and the second thermoelectric module and configured to extend to the third surface and the fourth surface, and a distance between the third shield member and the fourth shield member in the remaining portion of the first frame may be greater than a distance between the third shield member and the fourth shield member in the remaining portion of the second frame.

The fourth shield member may be symmetrical with the third shield member.

The first frame may guide a wiring connected to the first thermoelectric module.

The second frame may seal a space between the first substrate and the second substrate.

A thermoelectric system according to another embodiment of the present invention includes a thermoelectric device, a wiring portion electrically connected to the thermoelectric device, and a wiring accommodating portion disposed at an upper portion on one side of the thermoelectric device to accommodate the wiring portion, wherein the wiring accommodating portion includes a case disposed at an upper portion on the one side of the thermoelectric device, and a cover which covers the case, a bottom hole through which the wiring portion passes is formed in a bottom portion of the case, a side wall hole through which the wiring portion passes is formed in a side wall of the case, the bottom portion includes a bottom upper surface disposed to face the cover and a bottom lower surface disposed to face the thermoelectric device, and the bottom lower surface includes a first stepped portion which protrudes in a direction toward the thermoelectric device along an edge of the bottom hole.

The thermoelectric device may include a fluid flow portion, a thermoelectric module disposed on the fluid flow portion, and a shield member disposed on a side surface of the thermoelectric module on the fluid flow portion, the wiring accommodating portion may be disposed on an upper portion of the shield member, an upper hole through which the wiring portion passes may be formed in the upper portion of the shield member, and the upper hole may be disposed to correspond to the bottom hole.

The upper portion of the shield member may include an upper surface disposed to face the wiring accommodating portion, and a lower surface disposed to face the fluid flow portion, and the upper surface may include a second stepped portion which protrudes in a direction toward the wiring accommodating portion along an edge of the upper hole.

The second stepped portion may be disposed to be surrounded by the first stepped portion.

The first stepped portion and the second stepped portion may be disposed to be spaced apart from each other.

The side wall of the case includes a case outer surface disposed to face the outside of the case and a case inner surface disposed to face the inside of the case, and the case outer surface may include a third stepped portion which protrudes in a direction toward the outside of the case along an edge of the side wall hole.

A separation distance between the first stepped portion and the second stepped portion may be greater than a height of the third stepped portion.

A height of the second stepped portion may be higher than the bottom lower surface of the wiring accommodating portion and lower than the bottom upper surface of the wiring accommodating portion.

The thermoelectric system may further include an insulating member disposed between the upper portion of the shield member and the wiring accommodating portion.

The wiring accommodating portion may further include an insulating member disposed between the case and the cover.

A thermoelectric system according to still another embodiment of the present invention includes a first thermoelectric device, a second thermoelectric device disposed to be spaced apart from the first thermoelectric device, a first wiring portion electrically connected to the first thermoelectric device, a second wiring portion electrically connected to the second thermoelectric device, and a wiring accommodating portion disposed at an upper portion on one side of the first thermoelectric device and the second thermoelectric device to accommodate the first wiring portion and the second wiring portion, wherein the wiring accommodating portion includes a case disposed at an upper portion on one side of the first thermoelectric device and the second thermoelectric device, and a cover which covers the case, a first bottom hole through which the first wiring portion passes and a second bottom hole through which the second wiring portion passes are formed in a bottom portion of the case, a side wall hole through which the first wiring portion and the second wiring portion pass is formed in a side wall of the case, the bottom portion includes a bottom upper surface disposed to face the cover and a bottom lower surface disposed to face the thermoelectric device, and the bottom lower surface includes first stepped portions which respectively protrude in a direction toward the first thermoelectric device and the second thermoelectric device along edges of the first bottom hole and the second bottom hole.

Advantageous Effects

According to an embodiment of the present invention, it is possible to obtain a thermoelectric system which has a simple structure, is easily assembled, and is capable of accommodating a maximum number of thermoelectric elements within a predetermined space.

According to the embodiment of the present invention, it is possible to obtain a thermoelectric system having high thermoelectric performance by increasing a temperature difference between a high temperature part and a low temperature part.

The thermoelectric system according to the embodiment of the present invention can be applied to a power generation device that generates electricity using the temperature difference between the high temperature part and the low temperature part.

The thermoelectric system according to the embodiment of the present invention can be applied to a Peltier device that cools or heats a specific target such as a fluid.

DESCRIPTION OF DRAWINGS

FIG. 1 is a perspective view of a thermoelectric device according to an embodiment of the present invention.

FIG. 2 is an exploded view of a part of the thermoelectric device according to the embodiment of the present invention.

FIG. 3 is a perspective view of a fluid flow portion included in the thermoelectric device according to the embodiment of the present invention.

FIGS. 4 and 5 illustrate a thermoelectric element according to an embodiment of the present invention.

FIG. 6 is a plan view of a thermoelectric module according to an embodiment of the present invention.

FIG. 7 is an exploded perspective view of the thermoelectric module according to the embodiment of the present invention.

FIG. 8 is a perspective view of a sealing frame included in the thermoelectric module according to the embodiment of the present invention.

FIG. 9 is a perspective view of an insulating frame included in the thermoelectric module according to the embodiment of the present invention.

FIG. 10 is a cross-sectional view of a state in which a shield member is assembled to the thermoelectric device according to the embodiment of the present invention.

FIGS. 11 (*a*) and (*b*) illustrate enlarged cross sections of R1 and R2 of FIG. 10.

FIGS. 12 (*a*) and (*b*) illustrate enlarged cross sections of R3 and R4 of FIG. 9.

FIG. 13 illustrates a lower surface of a fluid guide of the present invention.

FIG. 14 (*a*) and (*b*) is a cross-sectional view of a thermoelectric device according to each of a comparative example and an embodiment.

FIG. 15 is a thermoelectric system according to an embodiment of the present invention.

FIG. 16 is an exploded perspective view of a wiring accommodating portion disposed at an upper portion on one side of a plurality of thermoelectric devices according to the embodiment of the present invention.

FIG. 17 is an enlarged view of D1 in FIG. 16.

FIG. 18 (*a*) is a top perspective view of a case of the wiring accommodating portion according to the embodiment of the present invention, and (b) is a bottom perspective view of the case of the wiring accommodating portion according to the embodiment of the present invention.

FIG. 19 (*a*) is a perspective view of a sixth shield member according to the embodiment of the present invention, and (b) is a perspective view of a fifth shield member according to the embodiment of the present invention.

FIG. 20 is a cross-sectional perspective view showing an internal structure of the wiring accommodating portion in a state in which the shield member and the wiring accommodating portion are assembled in the thermoelectric system according to the embodiment of the present invention.

FIG. 21 is a cross-sectional view of region E1 of FIG. 20.

FIG. 22 illustrates the internal structure of the wiring accommodating portion according to the embodiment of the present invention.

FIG. 23 is a top view of region F1 of FIG. 22.

FIG. 24 is a cross-sectional view of region F2 of FIG. 22.

MODES OF THE INVENTION

Exemplary embodiments of the present invention will be described in detail below with reference to the accompanying drawings.

However, the technical idea of the present invention is not limited to some of the embodiments described, but can be implemented in various different forms, and within the scope of the technical idea of the present invention, one or more of the components among the embodiments may be selectively combined or substituted and used.

In addition, the terms (including technical and scientific terms) used in the embodiments of the present invention may be interpreted as having meanings that are generally understood by a person of ordinary skill in the technical field to which the present invention belongs, unless explicitly and specifically defined and described, and commonly used terms such as terms defined in dictionaries may be interpreted in consideration of their contextual meaning in the related art.

Additionally, the terms used in the embodiments of the present invention are for the purpose of describing the embodiments and are not intended to limit the present invention.

In this specification, the singular may also include the plural unless the context clearly dictates otherwise, and when described as "at least one (or one or more) of A, B, and C," it may include one or more of all possible combinations of A, B, and C.

Additionally, in describing components of embodiments of the present invention, terms such as first, second, A, B, (a), (b), or the like may be used.

These terms are only intended to distinguish one component from another, and are not intended to limit the nature, order, or sequence of the component.

In addition, when a component is described as being "connected," "coupled," or "linked" to another component, it may include not only cases in which the component is directly connected, coupled, or linked to the other component, but also cases in which the component is "connected," "coupled," or "linked" by another component between the component and the other component.

Additionally, when a component is described as being formed or disposed on "on (above) or below (under)" another component, "above" or "below" includes not only cases in which the two components are in direct contact with each other, but also cases in which one or more other components are formed or disposed between the two components. Additionally, when expressed as "above or below," it can include the meaning of not only the upward direction but also the downward direction based on one component.

FIG. 1 is a perspective view of a thermoelectric device according to an embodiment of the present invention, FIG. 2 is a exploded view of a part of a thermoelectric device according to the embodiment of the present invention, and FIG. 3 is a perspective view of a fluid flow portion included in a thermoelectric device according to one embodiment of the present invention.

Referring to FIGS. 1 to 3, the thermoelectric device 1000 includes a fluid flow portion 1100 and a thermoelectric module 1200 disposed on a surface of the fluid flow portion 1100.

The thermoelectric device 1000 according to the embodiment of the present invention may generate power utilizing a temperature difference between a first fluid flowing through the inside of the fluid flow portion 1100 and a second fluid passing through the outside of the fluid flow portion 1100. A plurality of thermoelectric devices 1000 may be disposed in parallel to be spaced apart at a predetermined interval to form a thermoelectric system. Accordingly, thermoelectric performance or power generation performance per unit area can be maximized. The thermoelectric device may be referred to as a power generation device, and the thermoelectric system may be referred to as a power generation system.

The first fluid introduced into the fluid flow portion 1100 may be water, but is not limited thereto, and may be any type of fluid having cooling performance. A temperature of the first fluid introduced into the fluid flow portion 1100 may be less than 100° C., preferably less than 50° C., and more preferably less than 40° C., but is not limited thereto, and may be a fluid having a lower temperature than the second fluid has. A temperature of the first fluid discharged after passing through the fluid flow portion 1100 may be higher than the temperature of the first fluid introduced into the fluid flow portion 1100.

According to the embodiment of the present invention, the thermoelectric module 1200 may be disposed on a first surface 1110 of the fluid flow portion 1100 and a second surface 1120 facing the first surface 1110. The first fluid may flow from one side surface 1150 between the first surface 1110 and the second surface 1120 toward the other side surface 1160 opposite to the one side surface 1150 between the first surface 1110 and the second surface 1120. To this end, a fluid inlet may be disposed at one side surface, and a fluid outlet may be disposed at the other side surface. The second fluid may flow from a fourth surface 1140 which is an upper surface between the first surface 1110 and the second surface 1120 toward a third surface 1130 which is a lower surface between the first surface 1110 and the second surface 1120. For convenience of explanation, in this specification, a direction from the first surface 1110 toward the second surface 1120 may be referred to as a first direction, a direction from a fifth surface 1150 toward a sixth surface 1160, that is, a direction in which the first fluid passes, is referred to as a second direction, and a direction from the fourth surface 1140 toward the third surface 1130, that is, a direction in which the second fluid passes, is referred to as a third direction, but is not limited thereto.

Meanwhile, the second fluid passes through the outside of the fluid flow portion 1100, for example, a heat sink 1220 of the thermoelectric module 1200 disposed outside the fluid flow portion 1100. The second fluid may be exhaust heat or intake heat from an automobile, ship, or the like, but is not limited thereto. For example, a temperature of the second fluid may be 100° C. or higher, preferably 200° C. or higher, and more preferably 220° C. to 250° C., but is not limited thereto.

In this specification, an example in which the temperature of the first fluid flowing through the inside of the fluid flow portion 1100 is lower than the temperature of the second fluid passing through the heat sink 1220 of the thermoelectric module 1200 disposed outside the fluid flow portion 1100 will be described. Accordingly, in this specification, the fluid flow portion 1100 may be referred to as a duct or a cooling part. However, the embodiment of the present invention is not limited thereto, and the temperature of the first fluid flowing through the inside of the fluid flow portion 1100 may be higher than the temperature of the second fluid passing through the heat sink 1220 of the thermoelectric module 1200 disposed outside the fluid flow portion 1100.

As illustrated in FIG. 3, the fluid flow portion 1100 includes a flow path region 500, a fluid introduction region 510, and a fluid discharge region 520, and a thickness of the flow path region 500 in the first direction may be different from thicknesses of the fluid introduction region 510 and the fluid discharge region 520 in the first direction. For example, the thickness in the first direction in the flow path region 500 may be smaller than the thicknesses of the fluid introduction region 510 and the fluid discharge region 520 in the first direction. Here, the fluid introduction region 510 is a region including the one side surface 1150 of the fluid flow portion 1100, and the fluid discharge region 520 is a region including the other side surface 1160 of the fluid flow portion 1100.

Since thermoelectric modules 1200 are disposed on both surfaces of the flow path region 500, the number of thermoelectric devices accommodated per unit volume can be increased as the thickness of the flow path region 500 is formed to be smaller, and thermoelectric performance per unit volume can be improved.

According to the embodiment of the present invention, the thermoelectric module 1200 includes the thermoelectric element and the heat sink 1220 disposed on the thermoelectric element. The thermoelectric element according to the embodiment of the present invention may have a structure of a thermoelectric element 100 exemplified in FIGS. 4 to 5.

Referring to FIGS. 4 and 5, the thermoelectric element 100 includes a first substrate 110, a first electrode part 120, a P-type semiconductor element 130, an N-type semiconductor device 140, a second electrode part 150, and a second substrate 160.

The first electrode part 120 is disposed between the first substrate 110 and the P-type semiconductor device 130 and the N-type semiconductor device 140, and the second electrode part 150 is disposed between the second substrate 160 and the P-type semiconductor device 130 and the N-type semiconductor device 140. Accordingly, a plurality of P-type semiconductor devices 130 and a plurality of N-type semiconductor devices 140 are electrically connected by the first electrode parts 120 and the second electrode parts 150. A pair of P-type semiconductor device 130 and N-type semiconductor device 140 that are electrically connected and disposed between the first electrode part 120 and the second electrode part 150 may form a unit cell.

For example, when a voltage is applied to the first electrode part 120 and the second electrode part 150 through lead wires 181 and 182, due to the Peltier effect, the substrate through which a current flows from the P-type semiconductor device 130 to the N-type semiconductor device 140 absorbs heat and may act as a cooling part, and the substrate through which a current flows from the N-type semiconductor device 140 to the P-type semiconductor device 130 is heated and may act as a heating part. Alternatively, when a temperature difference is applied between the first electrode part 120 and the second electrode part 150, charges within the P-type semiconductor device 130 and the N-type semiconductor device 140 may is moved, and electricity may be generated due to the Seebeck effect.

Here, the P-type semiconductor device 130 and the N-type semiconductor device 140 may be bismuth telluride (Bi—Te)-based semiconductor devices containing bismuth (Bi) and tellurium (Te) as main raw materials. The P-type semiconductor device 130 may be a bismuth telluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type semiconductor device 130 may include 99 to 99.999 wt % of Bi—Sb—Te as a main raw material with respect to 100 wt % of the total weight, and may include 0.001 to 1 wt % of at least one of nickel (Ni), aluminum (Al), copper (Cu), silver (Ag), lead (Pb), boron (B), gallium (Ga), and indium (In). The N-type semiconductor device 140 may be a bismuth telluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type semiconductor device 140 may include 99 to 99.999 wt % of Bi—Se—Te as a main raw material with respect to 100 wt % of the total weight, and may include 0.001 to 1 wt % of at least one of nickel (Ni), aluminum (Al), copper (Cu), silver (Ag), lead (Pb), boron (B), gallium (Ga), and indium (In).

The P-type semiconductor device 130 and the N-type semiconductor device 140 may be formed in a bulk or stacked form. Generally, a bulk P-type semiconductor device 130 or a bulk N-type semiconductor device 140 may be obtained through a process of heat-treating a thermoelectric material to manufacture an ingot, crushing and sieving the ingot to obtain powder for a thermoelectric leg, sintering the powder, and cutting a sintered body. In this case, the P-type semiconductor device 130 and the N-type semiconductor device 140 may be polycrystalline thermoelectric legs. In this way, when the P-type semiconductor device 130 and the N-type semiconductor device 140 are polycrystalline thermoelectric legs, the strength of the P-type semiconductor device 130 and the N-type semiconductor device 140 may be increased. A stacked P-type semiconductor device 130 or a stacked N-type semiconductor device 140 may be obtained through a process of applying a paste containing a thermoelectric material on a sheet-shaped base material to form a unit member, and then laminating and cutting the unit members.

In this case, the pair of P-type semiconductor device 130 and N-type semiconductor device 140 may have the same shape and volume, or may have different shapes and volumes. For example, since electrical conduction characteristics of the P-type semiconductor device 130 and the N-type semiconductor device 140 are different, a height or cross-sectional area of the N-type semiconductor device 140 may be formed differently from a height or cross-sectional area of the P-type semiconductor device 130.

In this case, the P-type semiconductor device 130 or the N-type semiconductor device 140 may have a cylindrical shape, a polygonal column shape, an elliptical column shape, or the like.

In this specification, the semiconductor device may also be referred to as a thermoelectric leg, a thermoelectric structure, a semiconductor structure, or the like.

The performance of the thermoelectric element according to the embodiment of the present invention may be expressed by a figure of merit ZT. The figure of merit ZT may be expressed as illustrated in Equation 1.

$$ZT = \alpha^2 \cdot \sigma \cdot T/k \qquad \text{[Equation 1]}$$

Here, $\alpha$ is a Seebeck coefficient [V/K], $\sigma$ is an electrical conductivity [S/m], and $\alpha^2\sigma$ is a power factor ([W/mK$^2$]). Additionally, T is a temperature, k is a thermal conductivity [W/mK], and k may be expressed as $a \cdot cp \cdot \rho$, wherein a is a thermal diffusivity [cm$^2$/S], cp is a specific heat [J/gK], and $\rho$ is a density [g/cm$^3$].

To obtain the figure of merit ZT of the thermoelectric element, a Z value (V/K) is measured using a Z meter, and the figure of merit ZT may be calculated using the measured Z value.

Here, the first electrode part 120 disposed between the first substrate 110 and the P-type semiconductor device 130 and the N-type semiconductor device 140, and the second electrode part 150 disposed between the second substrate 160 and the P-type semiconductor device 130 and the N-type semiconductor device 140 include at least one of copper (Cu), silver (Ag), aluminum (Al), and nickel (Ni) and may have a thickness of 0.01 mm to 0.3 mm. When the thickness of the first electrode part 120 or the second electrode part 150 is less than 0.01 mm, a function as an electrode may deteriorate and the electrical conductivity performance may be reduced, and when the thickness exceeds 0.3 mm, the conductivity efficiency may be reduced due to an increase in resistance.

Additionally, the first substrate 110 and the second substrate 160 that face each other may be metal substrates, and a thickness thereof may be 0.1 mm to 1.5 mm. When the thickness of the metal substrate is less than 0.1 mm or more than 1.5 mm, heat dissipation characteristics or thermal conductivity may become excessively high, which may deteriorate the reliability of the thermoelectric element. In addition, when the first substrate 110 and the second substrate 160 are metal substrates, an insulating layer 170 may be further formed between the first substrate 110 and the first electrode part 120 and between the second substrate 160 and the second electrode part 150. The insulating layer 170 may include a material having a thermal conductivity of 1 to 20 W/mK. In this case, the insulating layer 170 may be a layer formed of a resin composition including at least one of an epoxy resin and a silicone resin, and an inorganic material or a silicone composite including silicone and an inorganic material, or an aluminum oxide layer. Here, the inorganic material may be at least one of an oxide, nitride and carbide of aluminum, boron, silicon, or the like.

Each insulating layer 170 may be one insulating layer or a plurality of insulating layers having different compositions. At least a part of a side surface of at least one of the first electrode part 120 and the second electrode part 150 is embedded in the insulating layer 170, and an upper surface of the insulating layer 170 disposed between a plurality of electrodes included in each of the electrode parts may have a recessed shape toward each of the substrates. When each insulating layer 170 is a plurality of insulating layers, at least a part of a side surface of at least one of the first electrode part 120 and the second electrode part 150 is embedded in the insulating layer 170 disposed at the top based on each of the substrates, and the uppermost surface of the insulating layer 170 disposed between the plurality of electrodes included in each of the electrode parts may have a recessed shape toward each of the substrates.

In this case, sizes of the first substrate 110 and the second substrate 160 may be formed differently. That is, the volume, thickness, or area of one of the first substrate 110 and the second substrate 160 may be formed to be larger than the volume, thickness, or area of the other. Here, the thickness may be a thickness in a direction from the first substrate 110 toward the second substrate 160, and the area may be an area in a direction perpendicular to the direction from the first substrate 110 toward the second substrate 160. Accordingly, the heat absorption performance or heat dissipation performance of the thermoelectric element can be improved. Preferably, the volume, thickness or area of the first substrate 110 may be formed to be larger than at least one of the volume, thickness, and area of the second substrate 160. In this case, when the first substrate 110 is disposed in a high temperature region for the Seebeck effect, when the first substrate 110 is applied to a heating region for the Peltier effect, or when a sealing member for protecting the thermoelectric element from the external environment is disposed on the first substrate 110, the first substrate 110 may have at least one of a volume, thickness, and area larger than that of the second substrate 160. In this case, the area of the first substrate 110 may be formed in a range of 1.2 to 5 times the area of the second substrate 160. When the area of the first substrate 110 is formed to be less than 1.2 times that of the second substrate 160, the effect on improving heat transfer efficiency is not significant, and when the area of the first substrate 110 exceeds 5 times, the heat transfer efficiency is significantly reduced, and it may be difficult to maintain a basic shape of the thermoelectric module.

In addition, a heat dissipation pattern, for example, an uneven pattern, may be formed on the surface of at least one of the first substrate 110 and the second substrate 160. Thus, the heat dissipation performance of the thermoelectric element can be improved. When the uneven pattern is formed on the surface that comes in contact with the P-type semiconductor device 130 or the N-type semiconductor device 140, bonding characteristics between the semiconductor device and the substrate can also be improved.

Although not illustrated, a sealing member may be additionally disposed between the first substrate 110 and the second substrate 160. The sealing member can be disposed on the side surfaces of the first electrode part 120, the P-type semiconductor device 130, the N-type semiconductor device 140, and the second electrode part 150 between the first substrate 110 and the second substrate 160. Thus, the first electrode part 120, the P-type semiconductor device 130, the N-type semiconductor device 140, and the second electrode part 150 may be shielded from external moisture, heat, contamination, or the like.

Referring again to FIGS. 1 and 2, the thermoelectric module 1200 may be disposed on each of the first surface 1110 and the second surface 1120 of the fluid flow portion 1100.

As described above, each of the thermoelectric elements 100 includes the first substrate 110 disposed to be in contact with the fluid flow portion 1100, the first electrode part 120 disposed on the first substrate 110, a plurality of semiconductor devices 130 and 140 disposed on the first electrode part 120, the second electrode part 150 disposed on the plurality of semiconductor devices 130 and 140, and the second substrate 160 disposed on the second electrode part 150, and the heat sink 1220 is disposed on the second substrate 160. In this case, the first substrate 110 of the thermoelectric element disposed on the fluid flow portion 1100 may be a metal substrate, and the metal substrate may be bonded to the surface of the fluid flow portion 1100 by a thermal interface material (TIM, not illustrated). Since the metal substrate has excellent heat transfer performance, heat transfer between the thermoelectric element and the fluid flow portion 1100 is easily performed. In addition, when the metal substrate and the fluid flow portion 1100 are bonded to each other by the TIM, heat transfer between the metal substrate and the fluid flow portion 1100 may not be hindered. Here, the metal substrate may be one of a copper substrate, an aluminum substrate, and a copper-aluminum substrate, but is not limited thereto.

The thermoelectric module 1200 may include a connector for extracting the electricity produced to the outside or for applying electricity to use as a Peltier. According to the embodiment of the present invention, an insulating frame 900 may be disposed around a connector to uniformly maintain a bonding force between the thermoelectric module 1200 and the fluid flow portion 1100 and protect a wiring W connected to the connector.

In addition, according to the embodiment of the present invention, a shield member 1500 may be further disposed to prevent moisture or contaminants from penetrating into the thermoelectric module 1200.

FIG. 6 is a plan view of the thermoelectric module according to the embodiment of the present invention, FIG. 7 is an exploded perspective view of the thermoelectric module according to the embodiment of the present invention, FIG. 8 is a perspective view of a sealing frame included in the thermoelectric module according to the embodiment of the present invention, and FIG. 9 is a perspective view of an insulating frame included in the thermoelectric module according to the embodiment of the present invention.

According to the embodiment of the present invention, the thermoelectric module 1200 may be disposed on each of the first surface 1110 and the second surface 1120 of the fluid flow portion 1100. The thermoelectric module 1200 includes the thermoelectric element and the heat sink, and duplicate descriptions of the same contents as those described with reference to FIGS. 4 and 5 will be omitted.

Referring to FIGS. 6 to 9, the thermoelectric module 1200 includes a first substrate 1201, a plurality of semiconductor devices 1202 disposed on the first substrate 1201, and a second substrate 1203 disposed on the plurality of semiconductor devices 1202. The first substrate 1201 may be the first substrate 110 described with reference to FIGS. 4 and 5, the plurality of semiconductor devices 1202 may be the P-type semiconductor device 130 and the N-type semiconductor device 140 described with reference to FIGS. 4 and 5, and the second substrate 1203 may be the second substrate 160 described with reference to FIGS. 4 and 5. Although not illustrated, the first electrode 120 described with reference to FIGS. 4 and 5 may be disposed between the first substrate 1201 and the plurality of semiconductor devices 1202, and the second electrode 150 described with reference to FIGS. 4 and 5 may be disposed between the plurality of semiconductor devices 1202 and the second substrate 1203.

According to the embodiment of the present invention, the first substrate 1201 is disposed on the first surface 1110 of the fluid flow portion 1100. In this case, the first substrate 1201 may be disposed to be in direct contact with the first surface 1110 of the fluid flow portion 1100, or may be disposed to be in indirect contact through the TIM, or the like.

According to the embodiment of the present invention, the first substrate 1201 includes first to fourth perimeters 1201S1 to 1201S4, the first perimeter 1201S1 and the second perimeter 1201S2 of the first substrate 1201 face each other, the third perimeter 1201S3 and the fourth perimeter 1201S4 of the first substrate 1201 face each other, and the first perimeter 1201S1 and the second perimeter 1201S2 of the first substrate 1201 may be sequentially disposed in a direction from the third surface 1130 toward the fourth surface 1140 of the fluid flow portion 1100.

According to the embodiment of the present invention, the second substrate 1203 includes a plurality of sub-second substrates 1203-1, . . . , 1203-4 disposed to be spaced apart from each other, and a sub-heat sink 1220-1, . . . , 1220-4 may be disposed on the sub-second substrates 1203-1, . . . , 1203-4, respectively. Accordingly, even when the second substrate 1203 is exposed to high temperature, a problem of the thermoelectric element being damaged due to bending of the second substrate 1203 can be reduced.

According to the embodiment of the present invention, a sealing frame 800 may be further disposed on the first substrate 1201. The sealing frame 800 may include an insulating material and may be disposed between the plurality of sub-second substrates 1203-1, . . . , 1203-4 on the first substrate 1201. Accordingly, the sealing frame 800 may separate the plurality of sub-second substrates 1203-1, . . . , 1203-4 from each other and seal a space between the first substrate 1201 and the plurality of sub-second substrates 1203-1, . . . , 1203-4.

According to the embodiment of the present invention, a first region 800A which is a part of the sealing frame 800 may be disposed on the first substrate 1201, and a second region 800B which is the remaining portion may be disposed between the second perimeter 1201S2 of the first substrate 1201 and the fourth surface 1140 of the fluid flow portion 1100 on the first surface 1110 of the fluid flow portion 1100. That is, the second region 800B of the sealing frame 800 may not overlap the first substrate 1201 in the first direction.

As described above, an electrode portion may be disposed between the first substrate 1201 and the plurality of semiconductor devices 1202.

Additionally, extension electrodes T1 and T2 extending toward the first perimeter 1201S1 of the first substrate 1201 may be further disposed on the first substrate 1201. In the embodiment of the present invention, the second fluid may flow in a direction from the second perimeter 1201S2 toward the first perimeter 1201S1. A connector may be disposed on the extension electrodes T1 and T2, and a wiring may be connected to the connector.

According to the embodiment of the present invention, an insulating frame 900 is further disposed on the extension electrodes T1 and T2. The insulating frame 900 may uniformly maintain a bonding force between the thermoelectric module 1200 and the fluid flow portion 1100 and protect the wiring connected to the connector.

According to the embodiment of the present invention, an opening 910 is formed in the insulating frame 900, the opening 910 may be disposed at a position corresponding to at least a part of the extension electrodes T1 and T2, and the opening 910 may be filled with a resin. Accordingly, a resin may be disposed on the extension electrodes T1 and T2 to provide insulation, and withstand voltage performance of the thermoelectric module 1200 can be improved. Here, the resin may include an epoxy resin or a silicone resin. When the insulating frame 900 includes a plastic material, the insulating frame 900 may be easily molded into various sizes and shapes. For example, the insulating frame 900 may be a plastic material which is applicable at a high temperature, such as polyphenylene sulfide (PPS). Accordingly, a problem of the shape of the insulating frame 900 being deformed by the high temperature second fluid can be prevented.

According to the embodiment of the present invention, a first region 900A which is a part of the insulating frame 900 is disposed on the first substrate 1201, and a second region 900B which is the remaining portion may be disposed between the first perimeter 1201S1 of the first substrate 1201 and the third surface 1130 of the fluid flow portion 1100 on the first surface 1110 of the fluid flow portion 1100. That is, the second region 900B of the insulating frame 900 may not overlap the first substrate 1201 in the first direction.

Meanwhile, referring to FIGS. 1 and 2, a shield member 1500 may be further disposed to prevent moisture or contaminants from penetrating into the thermoelectric module 1200. As described above, the fluid flow portion 1100 includes the first surface 1110 and the second surface 1120 spaced apart from the first surface 1110 in the first direction, and the thermoelectric module 1200 is disposed on each of the first surface 1110 and the second surface 1120 of the fluid flow portion 1100. The first fluid flows between the first surface 1110 and the second surface 1120 of the fluid flow portion 1100 in the second direction perpendicular to the first direction, and the second fluid having a higher temperature than the first fluid flows on the heat sink 1220 of the thermoelectric module 1200 in the third direction perpendicular to the first and second directions. Here, the third direction may be a direction from the fourth surface 1140 of the fluid flow portion 1100 toward the third surface 1130.

FIG. 10 is a cross-sectional view in a state in which the shield member is assembled to the thermoelectric device according to one embodiment of the present invention, FIGS. 11A and 11B illustrate enlarged cross-sections of R1 and R2 of FIG. 10, respectively, FIG. 12A and FIG. 12B illustrate enlarged cross-sections of R3 and R4 of FIG. 9, respectively, FIG. 13 illustrates a lower surface of a fluid guide of the present invention, and FIG. 14 is a cross-sectional view of a thermoelectric device according to each of a comparative example and an embodiment.

Referring to FIG. 2 and FIG. 10, in the state in which the thermoelectric module 1200 is assembled on each of the first surface 1110 and the second surface 1120 of the fluid flow portion 1100, a first shield member 1510 is disposed on the third surface 1130 of the fluid flow portion 1100, and a second shield member 1520 is disposed on the fourth surface 1140 of the fluid flow portion 1100. In FIG. 2, two first shield members 1510 are disposed in the second direction on the third surface 1130 of the fluid flow portion 1100, and two second shield members 1520 are disposed in the second direction on the fourth surface 1140 of the fluid flow portion 1100, but the number of first shield members 1510 and the number of second shield members 1520 are not limited thereto.

The first shield member 1510 is disposed on the third surface 1130 of the fluid flow portion 1100, but may extend to cover a part of the first surface 1110 and the second surface 1120 of the fluid flow portion 1100. For example, a cross section of the first shield member 1510 may have a "⊂" shape. Accordingly, the first shield member 1510 can protect not only the third surface 1130 of the fluid flow portion 1100, but also a boundary between the first surface 1110 and the third surface 1130 and a boundary between the second surface 1120 and the third surface 1130.

Similarly, the second shield member 1520 is disposed on the fourth surface 1140 of the fluid flow portion 1100, and may extend to cover a part of the first surface 1110 and the second surface 1120 of the fluid flow portion 1100. For example, a cross section of the second shield member 1520 may have a "⊂" shape. Accordingly, the second shield member 1520 can protect not only the fourth surface 1140 of the fluid flow portion 1100, but also a boundary between the first surface 1110 and the fourth surface 1140 and a boundary between the second surface 1120 and the fourth surface 1140.

In this case, a first insulating member 1610 may be further disposed between the fluid flow portion 1100 and the first shield member 1510, and a second insulating member 1620 may be further disposed between the fluid flow portion 1100 and the second shield member 1520. Accordingly, even when the high temperature second fluid flows on the surfaces of the first shield member 1510 and the second shield member 1520, the influence of the second fluid on cooling performance of the first fluid within the fluid flow portion 1100 can be minimized.

Fastening holes are formed in the first shield member 1510, through which the first shield member 1510 may be fastened to the third surface 1130 of the fluid flow portion 1100. Accordingly, the first insulating member 1610 may be disposed between the fastening holes. Likewise, fastening holes are formed in the second shield member 1520, through which the second shield member 1520 may be fastened to the fourth surface 1140 of the fluid flow portion 1100. Thus, the second insulating member 1620 may be disposed between the fastening holes.

According to the embodiment of the present invention, in the state in which the thermoelectric module 1200 is assembled on each of the first surface 1110 and the second surface 1120 of the fluid flow portion 1100, and the first shield member 1510 and the second shield member 1520 are assembled on the third surface 1130 and the fourth surface 1140 of the fluid flow portion 1100, a third shield member 1530 is disposed on the first surface 1110 of the fluid flow portion 1100 and the thermoelectric module 1200, and a fourth shield member 1540 is disposed on the second surface 1120 of the fluid flow portion 1100 and the thermoelectric module 1200. In FIG. 2, two third shield members 1530 are disposed in the second direction on the first surface 1110 of the fluid flow portion 1100, and two fourth shield members 1530 are disposed in the second direction on the second surface 1120 of the fluid flow portion 1100, but the number of third shield members 1530 and the number of fourth shield members 1540 are not limited thereto.

In this case, the third shield member 1530 may extend onto the first shield member 1510 of the third surface 1130 of the fluid flow portion 1100 and the second shield member 1520 of the fourth surface 1140, and the fourth shield member 1540 may also extend onto the first shield member 1510 of the third surface 1130 of the fluid flow portion 1100 and the second shield member 1520 of the fourth surface 1140.

That is, the third shield member 1530 includes a 3-1 region 1531 disposed on the third surface 1130 of the fluid flow portion 1100, a 3-2 region 1532 disposed on the first surface 1110 of the fluid flow portion 1100, and a 3-3 region 1533 disposed on the fourth surface 1140 of the fluid flow portion 1100.

In this case, the third surface 1130 of the fluid flow portion 1100, the first shield member 1510 and the 3-1 region 1531 of the third shield member 1530 are sequentially disposed in a direction from the fourth surface 1140 toward the third surface 1130. When the first insulating member 1610 is disposed between the third surface 1130 and the first shield member 1510, the third surface 1130, the first insulating member 1610, the first shield member 1510 and the 3-1 region 1531 of the third shield member 1530 may be sequentially disposed in the direction from the fourth surface 1140 toward the third surface 1130.

Additionally, the fourth surface 1140, the second shield member 1520 and the 3-3 region 1533 of the third shield member 1530 are sequentially disposed in a direction from the third surface 1130 toward the fourth surface 1140. When the second insulating member 1620 is disposed between the fourth surface 1140 and the second shield member 1520, the fourth surface 1140 of the fluid flow portion 1100, the second insulating member 1620, the second shield member 1520, and the 3-3 region 1533 of the third shield member 1530 may be sequentially disposed in the direction from the third surface 1130 toward the fourth surface 1140.

As described above, since the first shield member 1510 is covered by the third shield member 1530 and the fourth shield member 1540 on the third surface 1130 side of the fluid flow portion 1100, and the second shield member 1520 is covered by the third shield member 1530 and the fourth shield member 1540 on the fourth surface 1140 side of the fluid flow portion 1100, it is possible to prevent a problem of the second fluid flowing through a gap between the first shield member 1510 and the third shield member 1540, a gap between the first shield member 1510 and the fourth shield member 1540, a gap between the second shield member 1520 and the third shield member 1540, and a gap between the second shield member 1520 and the fourth shield member 1540, and thus the influence of the high temperature second fluid on the temperature of the first fluid within the fluid flow portion 1100 can be minimized, and thermoelectric performance can be improved.

According to the embodiment of the present invention, an insulating member (not illustrated) may be additionally disposed between the first shield member 1510 and the third shield member 1530 and between the second shield member 1520 and the third shield member 1530 on the first surface 1110 of the fluid flow portion 1100, and between the first shield member 1510 and the fourth shield member 1540 and between the second shield member 1520 and the fourth shield member 1540 on the second surface 1120 of the fluid flow portion 1100. Accordingly, the influence of the high temperature second fluid on the temperature of the first fluid within the fluid flow portion 1100 can be minimized, and the thermoelectric performance can be improved.

According to the embodiment of the present invention, the third shield member 1530 may include four or less curved portions in a direction in which the second fluid flows from the 3-3 region 1533 to the 3-1 region 1531. For example, the third shield member 1530 may include a curved portion 1530B4 disposed between the 3-3 region 1533 and the 3-2 region 1532, curved portions 1530B2 and 1530B3 disposed within the 3-2 region 1532, and a curved portion 1530B1 disposed between the 3-2 region 1532 and the 3-1 region 1531.

As the number of curved portions formed in the third shield member 1530 in the direction in which the second fluid flows increases, the flow of the second fluid is impeded, and a pressure difference between the introduction side and the discharge side of the second fluid tends to increase. As in the embodiment of the present invention, when the third shield member 1530 includes four or less curved portions in the direction in which the second fluid flows, this means that there are four or less points at which the flow of the second fluid changes, which can significantly reduce the pressure difference between the introduction side and the discharge side of the second fluid.

In a comparative example in which the third shield member 1530 includes eight curved portions in the direction in which the second fluid flows as illustrated in FIG. 14A, and an embodiment in which the third shield member 1530 includes four curved portions in the direction in which the second fluid flows as illustrated in FIG. 14B, the pressure difference between the introduction side and the discharge side of the second fluid was compared, and it was confirmed that the example (100 mmAg) had an improvement effect of 20 to 40% compared to the comparative example (150 mmAg).

Meanwhile, as described above, the first region 900A of the insulating frame 900 may be disposed on the first substrate 1201, and the second region 900B may be disposed between the first perimeter 1201S1 of the first substrate 1201 and the third surface 1130 of the fluid flow portion 1100 on the first surface 1110 of the fluid flow portion 1100. Additionally, the first region 800A of the sealing frame 800 may be disposed on the first substrate 1201, and the second region 800B may be disposed between the second perimeter 1201S2 of the first substrate 1201 and the fourth surface 1140 of the fluid flow portion 1100 on the first surface 1110 of the fluid flow portion 1100.

In this case, the sealing frame 800 and the insulating frame 900 may be disposed under the third shield member 1530. That is, the third shield member 1530 may be disposed to cover the sealing frame 800 and the insulating frame 900.

Referring to FIGS. 2, 11A and 11B, through holes S11 and S12 corresponding to each other may be disposed in each of the second region 900B of the insulating frame 900 and the third shield member 1530, and the through holes S11 and S12 may be disposed not to overlap the first substrate 1201 in the first direction. According to the embodiment of the present invention, a fastening member 200 is disposed in the through holes S11 and S12 to fix the first surface 1110 of the fluid flow portion 1100, the insulating frame 900, and the third shield member 1530. In this way, when the through holes S11 and S12 for the fastening member 200 are formed in the second region 900B of the insulating frame 900 extending to a region that deviates from the first perimeter 1201S1 of the first substrate 1201, since the first substrate 1201 and the fastening member 200 do not come in contact with each other, the withstand voltage of the thermoelectric element can be improved, and since the number of curved portions of the third shield member 1530 may not be increased, the flow of the second fluid can be improved.

Likewise, through holes S21 and S22 corresponding to each other may be disposed in each of the second region 800B of the sealing frame 800 and the third shield member 1530, and the through holes S21 and S22 may be disposed not to overlap the first substrate 1201 in the first direction. According to the embodiment of the present invention, a fastening member 200 is disposed in the through holes S21 and S22 to fix the first surface 1110 of the fluid flow portion 1100, the sealing frame 800, and the third shield member 1530. In this way, when the through holes S21 and S22 for the fastening member 200 are formed in the second region 800B of the sealing frame 800 extending to a region that deviates from the second perimeter 1201S2 of the first substrate 1201, since the first substrate 1201 and the fastening member 200 do not come in contact with each other, the withstand voltage can be improved, and since the number of curved portions of the third shield member 1530 may not be increased, the flow of the second fluid can be improved.

As illustrated in the comparative example of FIG. 14A, when the third shield member 1530 and the fluid flow portion 1100 are directly fastened to each other, an inclined surface has to be disposed on the third shield member 1530 to reduce the influence on the flow of the second fluid. Accordingly, lengths z1 and z2 of the third shield member 1530 have to be extended in the direction in which the second fluid flows, and thus an actual area for arranging a semiconductor device may be reduced. On the other hand, as illustrated in the embodiment of FIG. 14B, when the third shield member 1530 and the fluid flow portion 1100 are fastened through the insulating frame 900 and the sealing frame 800, since the length of the third shield member 1530 does not need to be extended more than necessary in the direction in which the second fluid flows without increasing the number of curved portions, the thermoelectric efficiency can be improved. In addition, as illustrated in the embodiment of FIG. 14B, when the third shield member 1530 and the fluid flow portion 1100 are fastened to each other through the insulating frame 900 and the sealing frame 800, since the first shield member 1510 may be fixed to the third surface 1130 of the fluid flow portion 1100 by the third shield member 1530 and the fourth shield member 1540, and the second shield member 1520 may be fixed to the fourth surface 1140 of the fluid flow portion 1100 by the third shield member 1530 and the fourth shield member 1540, the number of fastening holes and fastening members for fastening the first shield member 1510 and the third surface 1130 of the fluid flow portion 1100 and fastening the second shield member 1520 and the fourth surface 1140 of the fluid flow portion 1100 can be minimized.

According to the embodiment of the present invention, a head 200H of the fastening member 200 is disposed on the edge of the through holes S11 and S21 of the third shield member 1530, and the head 200H of the fastening member 200, the third shield member 1530 and the sealing frame 800, or the head 200H of the fastening member 200, the third shield member 1530 and the insulating frame 900 may overlap each other in the first direction. In this way, when the head 200H of the fastening member 200 is disposed on an insulating member such as the sealing frame 800 or the insulating frame 900, the withstand voltage of the thermoelectric device can be lowered, and since the third shield member 1530 does not come in direct contact with the first surface 1110 of the fluid flow portion 1100, the fluid flow portion 1100 can be protected from the high temperature second fluid.

Meanwhile, the through hole S22 of the sealing frame 800 or the through hole S12 of the insulating frame 900 may be disposed to be spaced apart from a pillar of the fastening member 200. To this end, a diameter of the through hole S22 of the sealing frame 800 or the through hole S12 of the insulating frame 900 may be larger than a diameter of the pillar of the fastening member 200. Accordingly, fastening of the fastening member 200 can be easily performed, and the sealing frame 800 or the insulating frame 900 can be protected under a frequent vibration environment.

Next, referring to FIG. 2, FIG. 12A and FIG. 12B, each of the second region 800B of the shield frame 800 and the second region 900B of the insulation frame 900 includes an upper surface disposed to face the third shield member 1530 and a lower surface disposed to face the first surface 1110 of the fluid flow portion 1100.

In this case, grooves G1 and G2 are formed in at least one of the lower surface of the second region 800B of the shield frame 800 and the lower surface of the second region 900B of the insulation frame 900, and a depth of each of the grooves G1 and G2 in the first direction may be greater than a height of the first substrate 1201 in the first direction. According to this, the grooves G1 and G2 may be filled with a sealant or adhesive, a bonding force between the shield frame 800 or the insulating frame 900 and the first surface 1110 of the fluid flow portion 1100 can be increased, and a problem of external substances penetrating into the first substrate 1201 can be prevented. However, in order to prevent overfilling of the sealant or adhesive, the depth of each of the grooves G1 and G2 in the first direction may be twice or less the height of the first substrate 1201 in the first direction.

Referring again to FIGS. 2 and 10 to 13, a first fluid guide 1710 is disposed on the 3-1 region 1531 of the third shield member 1530 in a direction from the fourth surface 1140 toward the third surface 1130 of the fluid flow portion 1100, and a second fluid guide 1720 is disposed on the 3-3 region 1533 of the third shield member 1530 in a direction from the third surface 1130 toward the fourth surface 1140 of the fluid flow portion 1100.

The second fluid guide 1720 branches the second fluid so that the second fluid is evenly distributed to the thermoelectric module disposed on the first surface 1110 of the fluid flow portion 1100 and the thermoelectric module disposed on the second surface 1120, and the first fluid guide 1710 allows the second fluid that has passed through the thermoelectric module disposed on the first surface 1110 of the fluid flow portion 1100 and the thermoelectric module disposed on the second surface 1120 to be discharged without causing a pressure difference between the introduction side and the discharge side.

In this case, the first fluid guide 1710 includes a surface 1712 parallel to the third surface 1130, and the second fluid guide 1720 includes a surface 1722 parallel to the fourth surface 1140. Accordingly, since a through hole through which a fastening member for fastening the first fluid guide 1710 and the third surface 1130 passes and a through hole through which a fastening member for fastening the second fluid guide 1720 and the fourth surface 1140 passes can be easily formed, and the head of the fastening member can be seated on the parallel surfaces 1712 and 1722 of the first and second fluid guides 1710 and 1720, stable fastening is possible.

Meanwhile, as illustrated in FIG. 13, a pan nut 1730 may be disposed on the lower surface of the first fluid guide 1710 or the second fluid guide 1720. The pan nut 1730 may be disposed to correspond to the through hole for the fastening member to pass therethrough, and may be made of an insulating material. Thus, the fastening member may pass through the pan nut 1730, and the first and second fluid guides 1710 and 1720 may be stably seated in the fluid flow portion 1100.

According to the embodiment of the present invention, a maximum width W1 of the first fluid guide 1710 in the first direction may be greater than a maximum width W2 of the second fluid guide 1720 in the first direction. Additionally, a distance d1 between the third shield member 1530 and the fourth shield member 1540 in the second region 900B of the insulating frame 900 may be greater than a distance d2 between the third shield member 1530 and the fourth shield member 1540 in the second region of the sealing frame 800. According to this, since a distance between the thermoelectric devices is narrower in a region in which the second fluid is discharged than in a region in which the second fluid is introduced, the second fluid can remain in the heat sink of the thermoelectric device for a longer time without being discharged at a high speed, thereby improving the thermoelectric performance of the thermoelectric device.

In the above, for convenience of explanation, the description is centered on the third shield member 1530 disposed on the first surface 1110 of the fluid flow portion 1100, but the same description can also be applied to the fourth shield member 1540 disposed on the second surface 1120 of the fluid flow portion 1100. The third shield member 1530 and the fourth shield member 1540 may be disposed symmetrically with respect to the fluid flow portion 1100.

Meanwhile, as described above, the fluid flow portion 1100 includes the flow path region 500, the fluid introduction region 510, and the fluid discharge region 520. Additionally, the thermoelectric module 1200 and the first to fourth shield members 1510, 1520, 1530 and 1540 are all disposed on the flow path region 500.

According to the embodiment of the present invention, in a state in which the thermoelectric module 1200 and the first to fourth shield members 1510, 1520, 1530 and 1540 are all disposed on the fluid flow portion 1100, a fifth shield member 1550 and a sixth shield member 1560 may be further disposed on the fluid introduction region 510, and a seventh shield member 1570 and an eighth shield member 1580 may be further disposed on the fluid discharge region 520. In this case, each of the fifth shield member 1550, the sixth shield member 1560, the seventh shield member 1570, and the eighth shield member 1580 may extend to cover a part of the third surface 1130 and the fourth surface 1140 of the fluid flow portion 1100. Although not illustrated, additional insulating materials may be disposed between the fluid introduction region 510 and the fifth shield member 1550, between the fluid introduction region 510 and the sixth shield member 1560, between the fluid discharge region 520 and the seventh shield member 1570, and between the fluid discharge region 520 and the eighth shield member 1580.

Meanwhile, as described above, the extension electrode of the thermoelectric module may extend in a direction in which the second fluid is discharged, a connector may be disposed on the extension electrode, and a wiring may be connected to the connector.

That is, when the second fluid flows in a direction from the fourth surface 1140 of the fluid flow portion 1100 toward the third surface 1130, the extension electrode, the connector, and the wiring may be disposed on the third surface 1130 side of the fluid flow portion 1100, and the wiring may be guided in a direction from the third surface 1130 toward the fourth surface 1140 in a space between the fluid introduction region 510 and the fifth shield member 1550 and between the fluid introduction region 510 and the sixth shield member 1560 and then drawn out to the outside.

According to the embodiment of the present invention, a plurality of thermoelectric devices may form a thermoelectric system.

FIG. 15 is the thermoelectric system according to an embodiment of the present invention.

Referring to FIG. 15, the thermoelectric system 2500 includes a first thermoelectric device 1000-1, a second thermoelectric device 1000-2 disposed to be spaced apart from the first thermoelectric device 1000-1 in the first direction, a third thermoelectric device 1000-3 disposed to be spaced apart from the second thermoelectric device 1000-2 in the first direction, a wiring portion (not illustrated) electrically connected to the first thermoelectric device 1000-1, the second thermoelectric device 1000-2, and the third thermoelectric device 1000-3, and a wiring accommodating portion 2700 disposed at an upper portion on one side of the first thermoelectric device 1000-1, the second thermoelectric device 1000-2, and the third thermoelectric device 1000-3 to accommodate a part of the wiring portion. For convenience of explanation, the first to third thermoelectric devices 1000-1, . . . , 1000-3 are used as an example in this specification, but the number of thermoelectric devices included in the thermoelectric system 2500 is not limited thereto and may include two or more thermoelectric devices.

The first fluid may flow through each of the first thermoelectric device 1000-1, the second thermoelectric device 1000-2, and the third thermoelectric device 1000-3 in the second direction perpendicular to the first direction, and the second fluid having a higher temperature than the first fluid may flow between the first thermoelectric device 1000-1, the second thermoelectric device 1000-2, and the third thermoelectric device 1000-3 in the third direction perpendicular to the first and second directions.

Each of the first thermoelectric device 1000-1, the second thermoelectric device 1000-2, and the third thermoelectric device 1000-3 may be the thermoelectric device described with reference to FIGS. 1 to 13.

As described above, the wiring connected to each of the thermoelectric modules included in the thermoelectric device is drawn out in a direction from the third surface 1130 of the fluid introduction region 510 of the fluid flow portion 1100 toward the fourth surface 1140.

According to the embodiment of the present invention, the wiring accommodating portion 2700 is disposed at an upper portion on one side of the plurality of thermoelectric devices, for example, the first thermoelectric device 1000-1, the second thermoelectric device 1000-2, and the third thermoelectric device 1000-3 which are disposed to be spaced apart from each other in the first direction. Here, the one side means the fluid introduction region 510 of the fluid flow portion 1100, and the upper portion refers to the surface disposed in the direction in which the second fluid is introduced, that is, the fourth surface 1140 of the fluid flow portion 1100 when the second fluid flows in the third direction from the fourth surface 1140 of the fluid flow portion 1100 toward the third surface 1130.

The wiring accommodating portion 2700 serves to collect the wiring drawn from the plurality of thermoelectric devices and guide the wiring to the outside. When the wiring accommodating portion 2700 is disposed at an upper portion on one side of the fluid flow portion 1100, that is, in the fluid introduction region 510, the flow of the second fluid passing through the thermoelectric module 1200 disposed in the flow path region 520 is not hindered, and thus the thermoelectric performance can be improved. In addition, since the temperature of the fluid introduction region 510 is lower than that of the fluid discharge region 520, a temperature of the wiring passing through the wiring accommodating portion 2700 can be maintained at a lower level.

FIG. 16 is an exploded perspective view of the wiring accommodating portion disposed at the upper portion on one side of the plurality of thermoelectric devices according to the embodiment of the present invention, and FIG. 17 is an enlarged view of D1 of FIG. 16.

Referring to FIGS. 16 and 17, the wiring accommodating portion 2700 according to the embodiment of the present invention includes a case 2710 disposed at the upper portion on one side of the first to third thermoelectric devices 1000-1, 1000-2 and 1000-3 and a cover 2720 that covers the case 2710. As described above, the fifth shield member 1550 and the sixth shield member 1560 may be further disposed on one side of the first to third thermoelectric devices 1000-1, 1000-2 and 1000-3, that is, in the fluid introduction region 510. The fifth shield member 1550 may be disposed on the first surface 1110 of the fluid flow portion 1100, and the sixth shield member 1560 may be disposed on the second surface 1120 of the fluid flow portion 1100. Thus, the wiring accommodating portion 2700 may be disposed on the fifth shield member 1550 and the sixth shield member 1560.

A plurality of bottom holes 2712H are formed in a bottom portion 2712 of the case 2710, and a plurality of side wall holes 2714H are formed in a side wall 2714 of the case 2710.

The first wiring portion W1 connected to the first thermoelectric device 1000-1 and guided in a direction from the third surface 1130 of the fluid flow portion 1100 toward the fourth surface 1140 may pass through the first bottom hole 2712H1 and then be drawn out through the side wall hole 2714H, the second wiring portion W2 connected to the second thermoelectric device 1000-2 and guided in the direction from the third surface 1130 of the fluid flow portion 1100 toward the fourth surface 1140 may pass through the second bottom hole 2712H2 and then be drawn out through the side wall hole 2714H, and the third wiring portion W3 connected to the third thermoelectric device 1000-3 and guided in the direction from the third surface 1130 of the fluid flow portion 1100 toward the fourth surface 1140 may pass through the third bottom hole 2712H3 and then be drawn out through the side wall hole 2714H.

In this case, the number of the plurality of side wall holes 2714H formed in the case 2710 may be less than the number of the plurality of bottom holes 2712H. For example, the wiring portion connected to each of the thermoelectric devices may pass through each of the bottom holes, and the plurality of wiring portions passing through the plurality of bottom holes may pass through one side wall hole.

According to the embodiment of the present invention, the wiring accommodating portion 2700 may further include an insulating member 2730. The insulating member 2730 may be disposed between the case 2710 and the cover 2720. In a state in which the wiring portion W passes through the bottom hole 2712H and the side wall hole 2714H of the case 2710, when the insulating member 2730 is accommodated in the case 2710 and the cover 2720 is disposed on the insulating member 2730, the wiring portion W can be protected from the high temperature second fluid.

According to the embodiment of the present invention, the case 2710 and the cover 2720 may be fastened by a fastening member 1900. To this end, fastening holes corresponding to each other may be formed in the case 2710 and the cover 2720. For example, a plurality of fastening holes 2714T spaced apart at a predetermined interval may be formed in a side wall opposite to the side wall in which the side wall hole 2714H is formed among the side walls of the case 2710, a plurality of fastening holes 2720T corresponding to the fastening holes 2714T of the case 2710 are also formed in a side wall of the cover 2720, and the fastening member 1900 may passing through the fastening hole 2720T and the fastening hole 2714T and fix the case 2710 and the cover 2720. In this case, the side wall of the case 2710 in which the fastening hole 2714T is formed may include a protrusion 2714P protruding toward the inside of the case 2710. The protrusion 2714P corresponds to the fastening hole 2714T and may accommodate the fastening hole 2714T. Accordingly, since the protrusion 2714P may accommodate the fastening member 1900 entering toward the inside of the case 2710, it is possible to prevent a problem of damaging the wiring portion W or the insulating member 2730 accommodated inside the case 2710 by the fastening member 1900.

FIG. 18A is a top perspective view of the case of the wiring accommodating portion according to the embodiment of the present invention, FIG. 18B is a bottom perspective view of the case of the wiring accommodating portion according to the embodiment of the present invention, FIG. 19A is a perspective view of the sixth shield member according to the embodiment of the present invention, FIG. 19B is a perspective view of the fifth shield member according to the embodiment of the present invention, FIG. 20 is a cross-sectional perspective view showing an internal structure of the wiring accommodating portion in a state in which the shield member and the wiring accommodating portion are assembled in the thermoelectric system according to the embodiment of the present invention, and FIG. 21 is a cross-sectional view of region E1 of FIG. 20.

Referring to FIGS. 18 to 21, the bottom portion 2712 of the case 2710 includes a bottom upper surface 2712U disposed to face the cover 2720 and a bottom lower surface 2712L disposed to face the thermoelectric device 1000. In addition, the bottom lower surface 2712L includes a first stepped portion 2712S that protrudes in a direction toward the thermoelectric device 1000 along the edge of the bottom hole 2712H.

The first stepped portion 2712S can protect the wiring portion W from the high temperature second fluid in a gap between upper portions of the fifth and sixth shield members 1550 and 1560 and a lower portion of the wiring accommodating portion 2700.

According to the embodiment of the present invention, an insulating member 1800 may be further disposed between the upper portions of the fifth and sixth shield members 1550 and 1560 and the wiring accommodating portion 2700. Accordingly, a possibility of the wiring portion W being exposed to the high temperature second fluid in the gap between the upper portions of the fifth and sixth shield members 1550 and 1560 and the lower portions of the wiring accommodating portion 2700 can be reduced.

Meanwhile, according to the embodiment of the present invention, the fifth shield member 1550 is disposed on the first surface 1110 of the fluid flow portion 1100, and the sixth shield member 1560 is disposed on the second surface 1120. The fifth shield member 1550 and the sixth shield member 1560 may be disposed to meet at the third surface 1130 and the fourth surface 1140 of the fluid flow portion 1100. For convenience of explanation, the fifth and sixth shield members 1550 and 1560 disposed on the third surface 1130 of the fluid flow portion 1100 are referred to as the upper portions of the fifth and sixth shield members 1550 and 1560. The wiring portion W electrically connected to each of the thermoelectric devices 1000 is guided in the direction from the third surface 1130 of the fluid flow portion 1100 toward the fourth surface 1140 in the spaces between the first surface 1110 of the fluid flow portion 1100 and the fifth shield member 1550 and between the second surface 1120 of the fluid flow portion 1100 and the sixth shield member 1560, and then passes through an upper hole 1500H formed by the fifth shield member 1550 and the sixth shield member 1560 and the bottom hole 2712H of the case 2710. To this end, the upper hole 1500H formed by the fifth shield member 1550 and the sixth shield member 1560 may be disposed to correspond to the bottom hole 2712H of the case 2710.

According to the embodiment of the present invention, the upper portions of the fifth and sixth shield members 1550 and 1560 include upper surfaces 1550U and 1560U disposed to face the wiring accommodating portion 2700 and lower surfaces 1550B and 1560B disposed to face the third surface 1130 of the fluid flow portion 1100. In addition, the upper surfaces 1550U and 1560U of the fifth and sixth shield members 1550 and 1560 include second stepped portions 1550S and 1560S that protrude in a direction toward the wiring accommodating portion 2700 along the edge of the upper hole 1500H.

The second stepped portions 1550S and 1560S can protect the wiring portion W from the high temperature second fluid in the gap between the upper portions of the fifth and sixth shield members 1550 and 1560 and the lower portion of the wiring accommodating portion 2700.

According to the embodiment of the present invention, the second stepped portion 1550S and 1560S may be disposed to be surrounded by the first stepped portion 2712S. Accordingly, since the wiring portion W in the gap between the upper portions of the fifth and sixth shield members 1550 and 1560 and the lower portion of the wiring accommodating portion 2700 is doubly protected by the first stepped portion 2712S and the second stepped portions 1550S and 1560S, the influence from the high temperature second fluid can be minimized.

According to the embodiment of the present invention, a height of each of the second stepped portions 1550S and 1560S may be higher than the bottom lower surface 2712L of the wiring accommodating portion 2700. Accordingly, since the wiring portion W in the gap between the upper portions of the fifth and sixth shield members 1550 and 1560 and the lower portion of the wiring accommodating portion 2700 is doubly protected by the first stepped portion 2712S and the second stepped portions 1550S and 1560S, the influence from the high temperature second fluid can be minimized. In addition, the second stepped portions 1550S and 1560S may be disposed so that the height thereof is lower than the bottom upper surface 2712U of the wiring accommodating portion 2700. Accordingly, a possibility of the wiring portion W being damaged by the edges of the second stepped portions 1550S and 1560S can be reduced.

FIG. 22 illustrates the internal structure of the wiring accommodating portion according to the embodiment of the present invention, FIG. 23 is a top view of region F1 of FIG. 22, and FIG. 24 is a cross-sectional view of region F2 of FIG. 22.

Referring to FIGS. 22 to 24, the side wall 1714 of the case 2710 of the wiring accommodating portion 2700 includes a case outer surface 2714_O disposed to face the outside of the case 2710 and a case inner surface 2714_I disposed to face the inside of the case 2710, and the case outer surface 2714_O includes a third stepped portion 2714S that protrudes toward the outside of the case 2710 along the edge of the side wall hole 2714H.

The side wall hole 2714H and the third stepped portion 2714S may be fitted into a hole 3000H of a support plate 3000 that fixes the plurality of thermoelectric devices 1000 on one side of the plurality of thermoelectric devices 1000. Accordingly, since the case 2710 of the wiring accommodating portion 2700 and the support plate 3000 may be fixed to each other, the number of fastening members for fastening the case 2710 of the wiring accommodating portion 2700 and the support plate 3000 can be reduced.

Meanwhile, according to the embodiment of the present invention, the first stepped portion 2712S is disposed on the bottom portion 2712 of the case 2710 of the wiring accommodating portion 2700, and the third stepped portion 2714S is disposed on the side wall 2714. In this case, in order to assemble the wiring accommodating portion 2700, the plurality of thermoelectric devices 1000 and the support plate 3000, the case 2710 of the wiring accommodating portion 2700 is moved toward the plurality of thermoelectric devices 1000 so that the second stepped portions 1550S and 1560S are disposed within the first stepped portion 2712S, and then moved toward the support plate 3000 so that the third stepped portion 2714S is fitted into the hole 3000H of the support plate 3000. In order to move the case 2710 of the wiring accommodating portion 2700 toward the support plate 3000, the first stepped portion 2712S surrounding the second stepped portions 1550S and 1560S may be disposed to be spaced apart from the second stepped portions 1550S and 1560S. In this case, a separation distance x1 between the first stepped portion 2712S and the second stepped portions 1550S and 1560S may be greater than a height x2 of the third stepped portion 2714S. Accordingly, the case outer surface 1714_O can move to a wall surface of the support plate 3000.

Throughout this specification, the thermoelectric element 100 is described as including the first substrate 110, the first electrode 120, the P-type thermoelectric leg 130, the N-type thermoelectric leg 140, the second electrode 150, and the second substrate 160, but the definition of the thermoelectric element 100 is not limited thereto, and the thermoelectric element 100 may include the first electrode 120, the P-type thermoelectric leg 130, the N-type thermoelectric leg 140, the second electrode 150, and the second substrate 160, and may also be disposed on the first substrate 110.

The power generation system can generate power from heat sources generated in ships, automobiles, power plants, and geothermal heat, a plurality of power generation devices and the like can be disposed to efficiently converge the heat sources. In this case, each of the power generation devices can improve cooling performance of the low temperature part of the thermoelectric element by improving the bonding force between the thermoelectric module and the fluid flow portion, and thus the efficiency and reliability of the power generation device can be improved, thereby improving fuel efficiency of transportation devices such as ships and vehicles. Therefore, in the shipping and transportation industries, it is possible to reduce transportation costs and create an eco-friendly industrial environment, and when the power generation device is applied to manufacturing industries such as steel mills, it is possible to reduce material costs, and the like.

Although the present invention has been described above with reference to preferred embodiments thereof, it will be understood by those skilled in the art that various modifications and changes may be made to the present invention without departing from the gist and scope of the present invention as set forth in the claims below.

The invention claimed is:

1. A thermoelectric device comprising:

a fluid flow portion including a first surface and a second surface spaced apart from the first surface in a first direction;

a first thermoelectric module disposed on the first surface;

a second thermoelectric module disposed on the second surface;

a first shield member disposed on a third surface formed between the first surface and the second surface;

a second shield member disposed on a fourth surface which is formed between the first surface and the second surface and faces the third surface; and a third shield member disposed on the first surface and the first thermoelectric module and configured to extend to the third surface and the fourth surface, wherein the third shield member includes a 3-1 region disposed on the third surface, a 3-2 region disposed on the first surface, and a 3-3 region disposed on the fourth surface, the third surface, the first shield member and the 3-1 region of the third shield member are sequentially disposed in a direction from the fourth surface toward the third surface, and the fourth surface, the second shield member and the 3-3 region of the third shield member are sequentially disposed in a direction from the third surface toward the fourth surface.

2. The thermoelectric device of claim 1, wherein the third shield member includes four or less curved portions from the 3-1 region to the 3-3 region.

3. The thermoelectric device of claim 2, wherein the third shield member includes a first curved portion disposed between the 3-1 region and the 3-2 region, second and third curved portions disposed within the 3-2 region, and a fourth curved portion disposed between the 3-2 region and the 3-3 region.

4. The thermoelectric device of claim 1, further comprising:

a first fluid guide disposed on the 3-1 region in a direction from the fourth surface toward the third surface; and a second fluid guide disposed on the 3-3 region in a direction from the third surface toward the fourth surface.

5. The thermoelectric device of claim 4, wherein at least one of the first fluid guide and the second fluid guide includes a surface parallel to at least one of the third surface and the fourth surface.

6. The thermoelectric device of claim 5, wherein a maximum width of the first fluid guide in the first direction is greater than a maximum width of the second fluid guide in the first direction.

7. The thermoelectric device of claim 1, wherein the first thermoelectric module includes:

a first substrate disposed on the first surface;

a first electrode part disposed on the first substrate;

a semiconductor device disposed on the first electrode part;

a second electrode part disposed on the semiconductor device;

a second substrate disposed on the second electrode part;

a heat sink disposed on the second substrate;

a first frame, a part of which is disposed on the first substrate and a remaining portion of which is disposed between a first perimeter of the first substrate and the third surface on the first surface; and a second frame, a part of which is disposed on the first substrate and a remaining portion of which is disposed between a second perimeter of the first substrate and the fourth surface on the first surface.

8. The thermoelectric device of claim 7, wherein first through holes corresponding to each other are disposed in the remaining portion of the first frame and the third shield member, respectively, and the first through holes do not overlap the first substrate in the first direction, and second through holes corresponding to each other are disposed in the remaining portion of the second frame and the third shield member, respectively, and the second through holes do not overlap the first substrate in the first direction.

9. The thermoelectric device of claim 7, wherein at least one of the remaining portion of the first frame and the remaining portion of the second frame includes an upper surface disposed to face the third shield member and a lower surface disposed to face the first surface, a groove is formed in the lower surface, and a depth of the groove in the first direction is greater than a height of the first substrate in the first direction.

10. The thermoelectric device of claim 9, wherein the groove is filled with a sealant.

11. The thermoelectric device of claim 7, further comprising a fourth shield member disposed on the second surface and the second thermoelectric module and extending to the third surface and the fourth surface.

12. The thermoelectric device of claim 11, wherein the fourth shield member is symmetrical with the third shield member.

13. The thermoelectric device of claim 12, wherein a distance between the third shield member and the fourth shield member in the remaining portion of the first frame is greater than a distance between the third shield member and the fourth shield member in the remaining portion of the second frame.

14. The thermoelectric device of claim 13, wherein the first frame guides a wiring connected to the first thermoelectric module.

15. The thermoelectric device of claim 13, wherein the second frame seals a space between the first substrate and the second substrate.

16. The thermoelectric device of claim 7, further comprising:

a first fluid guide disposed on the 3-1 region in a direction from the fourth surface toward the third surface; and a second fluid guide disposed on the 3-3 region in a direction from the third surface toward the fourth surface.

17. The thermoelectric device of claim 16, wherein at least one of the first fluid guide and the second fluid guide includes a surface parallel to at least one of the third surface and the fourth surface.

18. The thermoelectric device of claim 17, wherein a maximum width of the first fluid guide in the first direction is greater than a maximum width of the second fluid guide in the first direction.

19. The thermoelectric device of claim 1, wherein the first shield member extends to cover a part of the first surface and the second surface.

20. The thermoelectric device of claim 19, wherein the first surface, the first shield member and the 3-2 region of the third shield member are sequentially disposed in a direction from the second surface toward the first surface.

* * * * *